United States Patent
Allen et al.

(10) Patent No.: US 8,132,132 B2
(45) Date of Patent: Mar. 6, 2012

(54) METHODS AND APPARATUS FOR IMPLEMENTING PARAMETERIZABLE PROCESSORS AND PERIPHERALS

(75) Inventors: Tim Allen, Santa Cruz, CA (US); Michael Fairman, Santa Cruz, CA (US); Jeffrey Orion Pritchard, Santa Cruz, CA (US); Bryan Hoyer, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 267 days.

(21) Appl. No.: 11/372,550

(22) Filed: Mar. 10, 2006

(65) Prior Publication Data

US 2006/0190907 A1 Aug. 24, 2006

Related U.S. Application Data

(63) Continuation of application No. 11/256,239, filed on Oct. 21, 2005, which is a continuation of application No. 09/880,106, filed on Jun. 12, 2001, now Pat. No. 6,976,239.

(51) Int. Cl.
  *G06F 17/50* (2006.01)
(52) U.S. Cl. ........................................ 716/104; 716/116
(58) Field of Classification Search .......... 716/1, 16–18, 716/100, 104, 116, 117
  See application file for complete search history.

(56) References Cited

U.S. PATENT DOCUMENTS

| | | | |
|---|---|---|---|
| 4,814,970 A | 3/1989 | Barbagelata et al. | |
| 5,841,663 A | 11/1998 | Sharma et al. | 716/18 |
| 5,867,400 A | 2/1999 | El-Ghoroury et al. | |
| 5,870,588 A | 2/1999 | Rompaey et al. | |
| 5,883,814 A | 3/1999 | Luk et al. | 716/2 |
| 5,963,454 A | 10/1999 | Dockser et al. | 716/18 |
| 6,006,022 A | 12/1999 | Rhim et al. | 716/1 |
| 6,026,226 A | 2/2000 | Heile et al. | 716/12 |
| 6,049,837 A | 4/2000 | Youngman | 709/250 |

(Continued)

FOREIGN PATENT DOCUMENTS

EP 0645723 3/1995

(Continued)

OTHER PUBLICATIONS

Srivastava et al., "System Level Hardware Module Generation", IEEE Transactions on Very Large Scale Integration (VLSI) Systems, vol. 3, No. 1 Mar. 1995.

(Continued)

*Primary Examiner* — Vuthe Siek
(74) *Attorney, Agent, or Firm* — Weaver Austin Villeneuve & Sampson LLP

(57) ABSTRACT

Methods and apparatus are provided for implementing parameterizable processor cores and peripherals on a programmable chip. An input interface such as a wizard allows selection and parameterization of processor cores, peripherals, as well as other modules. The logic description for implementing the modules on a programmable chip can be dynamically generated, allowing extensive parameterization of various modules. Dynamic generation also allows the delivery of device driver logic onto a programmable chip. The logic description can include information for configuring a dynamically generated bus module to allow connectivity between the modules as well as connectivity with other on-chip and off-chip components. The logic description, possibly comprising HDL files, can then be automatically synthesized and provided to tools for downloading the logic description onto a programmable chip.

40 Claims, 30 Drawing Sheets

U.S. PATENT DOCUMENTS

| | | | | |
|---|---|---|---|---|
| 6,080,201 | A | 6/2000 | Hojat et al. | 703/14 |
| 6,272,451 | B1 | 8/2001 | Mason et al. | |
| 6,345,212 | B1 | 2/2002 | Nourse | 700/182 |
| 6,401,230 | B1 | 6/2002 | Ahanessians et al. | 716/1 |
| 6,453,456 | B1 | 9/2002 | Price | |
| 6,460,172 | B1 | 10/2002 | Insenser Farre et al. | 716/17 |
| 6,473,783 | B2 | 10/2002 | Goshey et al. | 709/203 |
| 6,477,683 | B1 | 11/2002 | Killian et al. | 716/1 |
| 6,477,697 | B1 | 11/2002 | Killian et al. | |
| 6,574,791 | B1 | 6/2003 | Gauthier et al. | 717/107 |
| 6,594,711 | B1 | 7/2003 | Anderson et al. | 710/22 |
| 6,697,948 | B1 | 2/2004 | Rabin et al. | |
| 6,701,515 | B1 | 3/2004 | Wilson et al. | |
| 6,760,888 | B2 | 7/2004 | Killian et al. | |
| 6,862,563 | B1 * | 3/2005 | Hakewill et al. | 703/14 |
| 6,904,527 | B1 | 6/2005 | Parlour et al. | |
| 6,976,239 | B1 | 12/2005 | Allen et al. | |
| 7,103,759 | B1 | 9/2006 | Blixt | |
| 7,676,784 | B2 | 3/2010 | Allen et al. | |
| 2002/0072893 | A1 * | 6/2002 | Wilson | 703/26 |
| 2003/0061409 | A1 * | 3/2003 | RuDusky | 710/8 |
| 2003/0093655 | A1 | 5/2003 | Gosior et al. | 712/228 |
| 2003/0120896 | A1 | 6/2003 | Gosior et al. | 712/32 |
| 2004/0015502 | A1 | 1/2004 | Alexander et al. | 707/100 |
| 2006/0036988 | A1 | 2/2006 | Allen et al. | |
| 2006/0174081 | A1 * | 8/2006 | Latta | 711/168 |
| 2008/0134127 | A1 | 6/2008 | Allen et al. | |

FOREIGN PATENT DOCUMENTS

| | | |
|---|---|---|
| WO | WO/02/095598 | 11/2002 |

OTHER PUBLICATIONS

Kevin Donovan, "SoC Peripheral Model Makes Dual Run", EE Times on-line, www.eetimes.com, Dec. 22, 2000.

Reinaldo A. Bergamaschi and William R. Lee, "Designing Systems-on-Chip Using Cores", acm 1-58113-188, Jul. 2000, pp. 420-424.

Lioupis et al., "A Systematic Approach to Software Peripheral for Embedded Systems," ACM, Feb. 1, 2004, pp. 140-145.

Hebert et al., "A Method to Derive Application-Specific Embedded Processing Cores", ACM, 2000, pp. 88-92.

Xilinx and ARC Cores Announce Alliance for Configurable Processor Codes and World Wide Network of Design Centers, Jul. 3, 2000 (printed from website http://web.archive.org/web/20000817174059/www.xilinx.com/prs_rls/arccores.htm on Mar. 29, 2006), 5 pages.

The Xilinx and ARC Cores Alliance for Configurable Processor Cores on Xilinx FPGAs, 2000 (printed from website http://web.archive.org/web/20000817161734/www.xilinx.com/products/logicore/alliance/arc/arcspot.htm on Mar. 28, 2006), 6 pages.

Xilinx Core Generator System 2.1i User Guide, 102 pages, 1999.

Alliance Core, LavaCORE™ Configurable Java™ Processor Core, Derivation Systems, Inc., Product Specification, Apr. 11, 2001, 5 pages.

Xilinx and Derivation Systems, Announce JAVA Processor Core for Virtex-II FPGAs, Apr. 16, 2001 (printed from website http://web.archive.org/web/20011024164340/www.xilinx.com/prs_rls/01341avacore.htm on Mar. 30, 2006), 4 pages.

Halfhill et al., "ARC Patent Looks Formidable—U.S. Patent Covers Automated Tools for Customizing Processor Cores," Microprocessor Report—The Insider's Guide to Microprocessor Hardware, Aug. 29, 2005, 9 pages.

Halfhill et al., "Tensilica Patents Raise Eyebrows—Legal Protection of Configurable-CPU Technology Could Frusturate Competitors," Microprocessor Report—The Insider's Guide to Microprocessor Hardware, Dec. 9, 2002, 5 pages.

Rajesh K. Gupta and Vervant Zorian, "Introduction Core-Based System Design", IEEE, Oct.-Dec. 1997, pp. 15-25.

Lach et al, "FPGA Fingerprinting Techniques for Protecting Intellectual Property", http://citeseer.ist.psu.edu/lach98fpga.html, 1998.

Hong et al., "Behavioral Synthesis Techniques for Intellectual Property Protection", http://citeseer.ist.psu.edu/206950.html, 1997.

Nios II, "Nios II Flash Programmer," User Guide, Altera Corporation, Copyright Dec. 2004, 34 pages.

Office Action mailed Jul. 27, 2004, from U.S. Appl. No. 09/880,106.

Final Office Action mailed Dec. 22, 2004, from U.S. Appl. No. 09/880,106.

Office Action mailed Feb. 16, 2005, from U.S. Appl. No. 09/880,106.

Notice of Allowance mailed Jul. 28, 2005, from U.S. Appl. No. 09/880,106.

U.S. Appl. No. 11/256,239, filed Dec. 21, 2005, titled "Methods and Apparatus For Implementing Parameterizable Processors and Peripherals."

Office Action mailed Dec. 4, 2008, from U.S. Appl. No. 11/256,239.

Office Action mailed May 27, 2009, from U.S. Appl. No. 11/256,239.

U.S. Appl. No. 11/841,715, filed Aug. 20, 2007, titled "Methods and Apparatus for Implementing Parameterizable Processors and Peripherals."

U.S. Appl. No. 11/256,311, filed Oct. 21, 2005, titled "Methods and Apparatus for Implementing Parameterizable Processors and Peripherals."

Office Action mailed May 9, 2008, from U.S. Appl. No. 11/256,311.

Office Action mailed Dec. 31, 2008, from U.S. Appl. No. 11/256,311.

Notice of Allowance mailed Jun. 11, 2009, from U.S. Appl. No. 11/256,311.

Brochure entitled "Triscend A7 32-bit Configurable System-on-Chip", 3 pages, Jun. 6, 2001.

Website printout from www.arccores.com/products/arc_core.htm overview entitled "The Tangent-A4 Processor Core", 4 pages downloaded Jun. 6, 2001.

Office Action dated Jan. 13, 2011, from U.S. Appl. No. 11/841,715.

Final Office Action dated Mar. 24, 2011, from U.S. Appl. No. 11/256,239.

Office Action mailed Dec. 7, 2009, from U.S. Appl. No. 11/256,239.

Office Action mailed Nov. 13, 2009 2008, from U.S. Appl. No. 11/841,715.

Allowed Claims for U.S. Appl. No. 11/256,311.

Supplemental Notice of Allowance mailed Oct. 8, 2009, from U.S. Appl. No. 11/256,311. U.S. Appl. No. 11/256,311.

Final Office Action mailed Apr. 21, 2010, from U.S. Appl. No. 11/841,715.

Office Action dated Oct. 21, 2010, U.S. Appl. No. 11/256,239.

Final Office Action Apr. 21, 2010, U.S. Appl. No. 11/841,715.

Office Action dated Jul. 27, 2011, U.S. Appl. No. 11/256,239.

Notice of Allowance dated Jun. 3, 2011, U.S. Appl. No. 11/841,715.

* cited by examiner

METHODS AND APPARATUS FOR IMPLEMENTING PARAMETERIZABLE PROCESSORS AND PERIPHERALS

CROSS-REFERENCE TO RELATED APPLICATIONS

This application is a continuation of U.S. patent application Ser. No. 11/256,239, filed on Oct. 21, 2005, which in turn is a continuation of U.S. patent application Ser. No. 09/880, 106, filed on Jun. 12, 2001, now U.S. Pat. No. 6,976,239. The entire disclosures of these applications are incorporated herein by reference for all purposes.

COPYRIGHT NOTICE

A portion of the disclosure of this patent document contains material which is subject to copyright protection. The copyright owner has no objection to the facsimile reproduction by any one of the patent disclosure, as it appears in the Patent and Trademark Office patent files or records, but otherwise reserves all copyright rights whatsoever.

COMPUTER PROGRAM LISTING

Computer program files in Appendix A and Appendix B are provided on compact disks titled Copy 1 and Copy 2. Compact disks titled Copy 1 and Copy 2 are hereby incorporated by reference for all purposes in their entirety. The computer program file names, size in bytes, and creation dates are listed as follows:

| File Name | Size in Bytes | Creation Date |
|---|---|---|
| Appendix A | | |
| perl_script.doc | 209,408 | Jun. 08, 2001 11:33a |
| Appendix B | | |
| HDL_parse.pm.doc | 29,543 | Jun. 11, 2001 11:23a |
| crush_names.pm.doc | 8,430 | Jun. 11, 2001 11:23a |
| default_generator_program.pl.doc | 12,831 | Jun. 11, 2001 11:23a |
| get_sopc_path.pl.doc | 561 | Jun. 11, 2001 11:23a |
| mif2sim.pl.doc | 904 | Jun. 11, 2001 11:23a |
| mk_bsf.pm.doc | 18,115 | Jun. 11, 2001 11:24a |
| mk_custom_sdk.pl.doc | 428 | Jun. 11, 2001 11:23a |
| mk_custom_sdk.pm.doc | 42,118 | Jun. 11, 2001 11:24a |
| mk_nios.pl.doc | 16,534 | Jun. 11, 2001 11:25a |
| mk_pio.pl.doc | 2,353 | Jun. 11, 2001 11:24a |
| mk_ram.pl.doc | 14,049 | Jun. 11, 2001 11:24a |
| mk_spi.pl.doc | 3,842 | Jun. 11, 2001 11:24a |
| mk_systembus.pl.doc | 29,660 | Jun. 11, 2001 11:23a |
| mk_timer.pl.doc | 1,767 | Jun. 11, 2001 11:24a |
| mk_uart.pl.doc | 7,773 | Jun. 11, 2001 11:25a |
| mk_usersocket.pl.doc | 5,736 | Jun. 11, 2001 11:25a |
| nios-convert.pl.doc | 14,582 | Jun. 11, 2001 11:23a |
| nios.pm.doc | 8,199 | Jun. 11, 2001 11:24a |
| pbm_gen.pm.doc | 151,734 | Jun. 11, 2001 11:24a |
| ptf_parse.pm.doc | 16,116 | Jun. 11, 2001 11:23a |
| ptf_update.pl.doc | 195 | Jun. 11, 2001 11:23a |
| ptf_update.pm.doc | 24,800 | Jun. 11, 2001 11:24a |
| sdram_pbm_gen.pm.doc | 150,179 | Jun. 11, 2001 11:24a |
| srec2mif.pl.doc | 1697 | Jun. 11, 2001 11:23a |
| srec2sim.pl.doc | 6,149 | Jun. 11, 2001 11:23a |
| tables_2D.pm.doc | 3,587 | Jun. 11, 2001 11:24a |
| v2vhd.pm.doc | 132,347 | Jun. 11, 2001 11:24a |
| vhdl_simulation.pl.doc | 153,653 | Jun. 11, 2001 11:23a |
| vpp.pm.doc | 153,976 | Jun. 11, 2001 11:24a |
| vpp_ptf_parse.pm.doc | 10,650 | Jun. 11, 2001 11:24a |
| wiz_convert.pm.doc | 6,710 | Jun. 11, 2001 11:24a |
| wiz_utils.pm.doc | 49,537 | Jun. 11, 2001 11:24a |

BACKGROUND OF THE INVENTION

1. Field of the Invention

The present invention relates to implementing a processor and peripherals. More specifically, the present invention relates to methods and apparatus for enabling the description and implementation of parameterizable processors and peripherals on a programmable chip.

2. Description of the Prior Art

A number of benefits have spurred efforts towards higher levels of system integration. Integrating processors and peripherals on a single integrated circuit allows compact system size, low power requirements, durability, high-performance, and low unit costs. The integration efforts have been focused in several areas. Some efforts have been focused on microcontrollers. Standard microcontrollers are generic components that can be used in a variety of applications. Generic microcontrollers can be found in microwave ovens, television remote controls, digital clocks, etc. Many microcontrollers include a processor, memory, and peripherals on a single integrated circuit. Microcontrollers are available with a variety of different price, performance, and peripheral integration options and are sold by companies such as Microchip Corporation of Chandler, Ariz. and Motorola Corporation of Arlington Heights, Ill. However, microcontrollers are not application-specific. Typical microcontroller based systems require additional integrated circuit components to provide system specific logic.

A wide variety of different microcontrollers are also required because microcontrollers are not programmable. That is, if a microcontroller is fabricated to work with one particular type of memory, it typically will not work with other types of memory. A different microcontroller will have to be used. Furthermore, although microcontrollers can only be used in certain contexts, they are not optimized for any particular application. Typical microcontrollers may include logic that is unnecessary in a particular application or may not include logic that is particularly essential. The drawbacks limit the efficiency of microcontroller operation.

Other integration efforts have been focused in the area of application-specific integrated circuits or ASICs. ASICs are custom-designed integrated circuits for specific usages. ASIC design tools are available from Synopsys of Mountain View, Calif. and Avant! of Fremont, Calif. ASICs can include processors and peripherals. Because ASICs are custom-designed, they are relatively fast compared to generic microcontrollers. However, the process of designing, verifying, fabricating, and testing ASICs is time-consuming and expensive. Any flaw uncovered on a particular ASIC after fabrication is complete requires a vast amount of time and expense to correct. Furthermore, like generic microcontrollers, ASICs are not programmable. An ASIC fabricated with a single timer can not be reconfigured to have a second timer.

More recently, some efforts have been focused on integration in the context of programmable chips. Programmable logic allows custom logic in an integrated circuit while avoiding time-consuming and expensive engineering processes associated with designing ASICs. Many programmable logic chips can be reconfigured with a new design relatively quickly. Triscend Corporation of Mountain View, Calif. offers a graphical user interface in its "FastChip Tool" for specifying a collection of peripherals for use with hard-wired processor core. However, the Triscend tool does not allow configuration of the processor core, as that core is built into the target hardware device. In one example, the processor core of a Triscend programmable chip can not be reconfigured to run faster or slower based on the specific application requirements.

A processor core based on hardwired logic is less flexible than a processor core based on undifferentiated programmable logic. ARC Cores of Elstree, United Kingdom provides a graphical user interface in its ARChitect tool to configure processor cores in programmable chips. However, ARC Cores does not provide parameterizable peripherals that can be easily integrated with the parameterizable processor core and downloaded onto a programmable chip. It has proven difficult to enable parameterization of processor cores and peripherals in a programmable chip. Differing standards for peripheral interface buses cause problems. Many problems occur at the interconnection level between processor and peripherals.

It is therefore desirable to provide improved methods and apparatus for implementing programmable chips.

SUMMARY OF THE INVENTION

Methods and apparatus are provided for implementing parameterizable processor cores and peripherals on programmable hardware. An input interface such as a wizard allows selection and parameterization of processor cores, peripherals, as well as other modules. The logic description for implementing the modules on programmable hardware can be dynamically generated, allowing extensive parameterization of various modules. Dynamic generation also allows the delivery of device driver logic onto the programmable hardware. The logic description can include information for configuring a dynamically generated bus module to allow connectivity between the modules as well as connectivity with other on-chip and off-chip components. The logic description, possibly comprising HDL files, can then be automatically synthesized and provided to tools for downloading the logic description onto the programmable hardware.

In one embodiment of the invention, a method for implementing an electronic design on programmable hardware is provided. A description of a first component for implementation on the programmable hardware is received. A first component parameter associated with the first component is identified. A description of a second component for implementation on the programmable hardware is received. A second component parameter associated with the second component is identified. A logic description using the first component parameter and the second component parameter is generated. The first component is a parameterizable processor core. The second component is parameterizable. The logic description provides logic information for implementing the first component and the second component on the programmable hardware.

In another embodiment, a method for implementing a programmable chip is provided. A processor core design associated with the programmable chip is received. A processor core parameter associated with the processor core design is identified. A peripheral design associated with the programmable chip is received. A logic description using the processor core parameter and the peripheral design is generated. The processor core design is parameterizable. The peripheral design is parameterizable. The logic description provides logic information for implementing the processor core and the peripheral on the programmable chip.

In yet another embodiment, a method of implementing a programmable chip is provided. A processor core design associated with the programmable chip is received. A peripheral design associated with the programmable chip is also received. A peripheral parameter associated with the peripheral design is identified. A logic description using the processor core design and the peripheral parameter is generated. The processor core design is parameterizable. The peripheral design is also parameterizable. The logic description provides logic information for implementing the processor core and the peripheral on the programmable chip.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
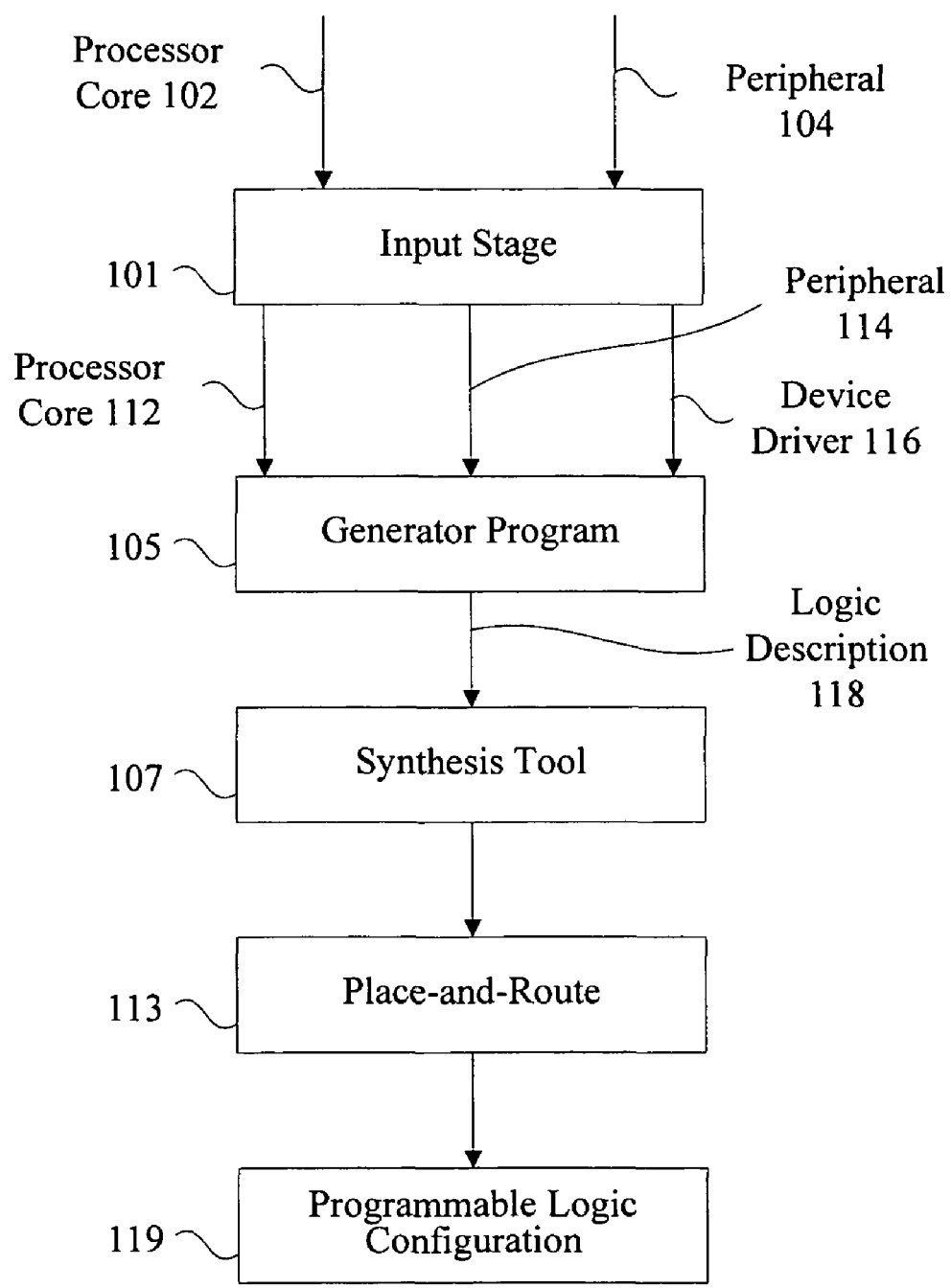
FIG. 1 is a process flow diagram showing the operation of a system that can use the techniques of the present invention.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Methods and apparatus are provided for enabling the efficient implementation of a programmable chip with a parameterizable processor core and parameterizable peripherals. The logic description used to implement the processor core and peripherals on a programmable chip such as a programmable chip can be dynamically generated.

According to various embodiments, an input interface is provided to allow a user to select and parameterize modules for a programmable chip. Some examples of modules are processor cores such as a RISC processor core, peripheral interfaces such as an interface to external memory, and peripheral components such as a timer or universal asynchronous receiver transmitter (UART). Each processor core, peripherals, as well as any other modules can all be interconnected on the programmable chip. The modules can also be connected with on-chip or off-chip components, not provided via the interface.

An input can use wizards to allow selection and parameterization of modules. Each wizard displayed can spawn additional sub-wizards to allow parameterization of peripheral components and peripheral interfaces. The graphical user interface allows for not only selection and parameterization of known peripherals, but the interface also allows for selection and parameterization of third party or user-defined peripherals. In one example, a library of modules may only contain synchronous FIFO modules. A user can create and define an asynchronous FIFO module. The graphical user interface then allows the user to select the width and the depth of the asynchronous FIFO to be implemented in a programmable chip. Configuring a programmable chip with a particular logic description or downloading a logic description onto a programmable chip is referred to herein as implementing a programmable chip. Some examples of programmable chips that can be implemented using the techniques of the present invention are programmable logic devices, complex programmable logic devices, programmable logic arrays, programmable array logic devices, and field-programmable gate arrays.

According to various embodiments, after a processor core and peripherals are selected and parameterized, a generator program can be used to dynamically create a logic description for implementing a programmable chip. A dynamically generated bus module can also be created to allow communication between processor cores, peripherals, and other modules. Dynamically generating a logic description allows the implementation of many different processor cores and peripherals with a wide range of parameter settings. Dynamically generating a logic description also allows custom designed modules and the delivery of embedded device driver logic. Device drivers are typically written in software to allow a peripheral to communicate with a particular processor. However, locating the associated software device driver for a particular processor can be cumbersome. According to various embodiments, methods and apparatus are provided for implementing device driver logic on the programmable chip so that software device drivers are no longer needed for particular modules.

One of the many benefits of generating processor cores, peripherals, and bus modules is that it allows integrated systems with fewer defects. Conventional systems lead to a variety of defects at the interconnection level between the various modules on a programmable chip.

FIG. 1 is a diagrammatic representation of the various programs, tools, and stages that can be used to implement a programmable chip. An input stage 101 receives selection and parameter information typically from a user about a processor core 102 and a peripheral 104 to be implemented on a programmable chip. A generator program creates a logic description of the various modules using processor core information 112, peripheral information 114, and device driver information 116. The logic description 118 can then be passed to a variety of synthesis tools, place and route programs, and programmable logic configuration tools to allow a logic description to be downloaded onto the programmable chip.

More specifically, an input stage 101 allows selection and parameterization of various modules in a programmable chip. The input stage may be a graphical user interface using wizards for allowing efficient or convenient entry of information. The input stage may also be a text interface or a program reading a data file such as a spreadsheet, database table, or schematic to acquire selection and parameterization information. The input stage 101 produces an output containing information about the various modules selected. In this example, the modules selected are processor core 102 and peripheral 104. In one embodiment, the output can be data file such as an ASCII file indicating that a 16-bit RISC processor having multiplier logic and a 32-bit address bus interface was selected along with a 115,200 bps UART with a stop bit. The ASCII file can also contain information about the type of programmable chip on which the modules should be implemented. An example of an ASCII file is the PTF file provided in Appendix A.

The generator program 105 can identify the parameters of the selected processor core 112 and peripheral 114 to generate a logic description with information for implementing the various modules. The generator program 105 can also incorporate device driver information 116 into the logic description 118. The process of generating the logic description is also described further below. The generator program 103 can be a Perl script creating HDL files such as Verilog, Abel, VHDL, and AHDL files from the module information entered by a user. According to various embodiments, the generator program 103 can also provide information to a synthesis tool 107 to allow HDL files to be automatically synthesized. Some of the available synthesis tools are Leonardo Spectrum, available from Mentor Graphics Corporation of Wilsonville, Oreg. and Synplify available from Synplicity Corporation of Sunnyvale, Calif.

As will be appreciated by one of skill in the art, the input stage 101, generator program 105, and synthesis tool 107 are separate programs. The interface between the separate programs can be a database file, a log, or simply messages transmitted between the programs. For example, instead of writing a PTF file to storage, the input stage 101 can send messages directly to the generator program 105 to allow the generator program to create a logic description. Similarly, the generator program can provide information directly to the synthesis tool instead of writing HDL files. Similarly, input stage 101, generator program 105, and synthesis tool 107 can be integrated into a single program.

A user may select and parameterize various modules and an integrated program can then take the user selections and output a logic description in the form of a synthesized netlist without intermediate PTF or HDL files. Any mechanism for depicting the logic to be programmed onto a programmable chip is referred to herein as a logic description. According to various embodiments, a logic description is an HDL file such as a VHDL, Abel, AHDL, or Verilog file. A logic description may be in various stages of processing between the user selection of components and parameters to the final configuration of the programmable chip. According to other embodiments, a logic description is a synthesized netlist such as an EDF file.

A synthesis tool 107 can take HDL files and output EDF files. An EDF file is one example of a synthesized netlist file that can be output by the synthesis tool 107. Various synthesized netlist formats will be appreciated by one of skill in the art. The synthesized netlist file can be read by a place and route tool 113. A place and route tool typically locates logic cells onto specific logic elements of a target hardware device and connects wires between the inputs and outputs of the various logic elements in accordance with logic required to implement an electronic design. A programmable logic configuration stage 119 can take the output of the place and route tool to program the logic device with the user selected and parameterized modules. According to various embodiments, the place and route tool 113 and the programmable logic configuration stage 119 are provided in the Quartus Development Tool, available from Altera Corporation of San Jose, Calif. As will be appreciated by one of skill in the art, a variety of synthesis, place and route, and programmable logic configuration tools can be used to implement various techniques of the present invention.

As noted above, different stages and programs can be integrated in a variety of manners. According to one embodiment, the input stage 101, the generator program 105, the synthesis tool 107, the place and route tool 113, and the programmable logic configuration stage 119 are integrated into a single program. The various stages are automatically run and transparent to a user. In one example, no intermediate files such as PTF files, HDL files, or EDF files are generated when the various stages are integrated into a single program. Nonetheless, the program can receive the user selected modules, generate an logic description depicting logic for implementing the various selected modules, and implement the programmable chip. As will be appreciated by one of skill in the art, HDL files and EDF files are mere examples of a logic description. Other file formats as well internal program representations are other examples of a logic description. Internal program representations can be transitory data used by a program to provide information for implementing parameterizable processor cores and peripherals on programmable chip.

Figure 2:
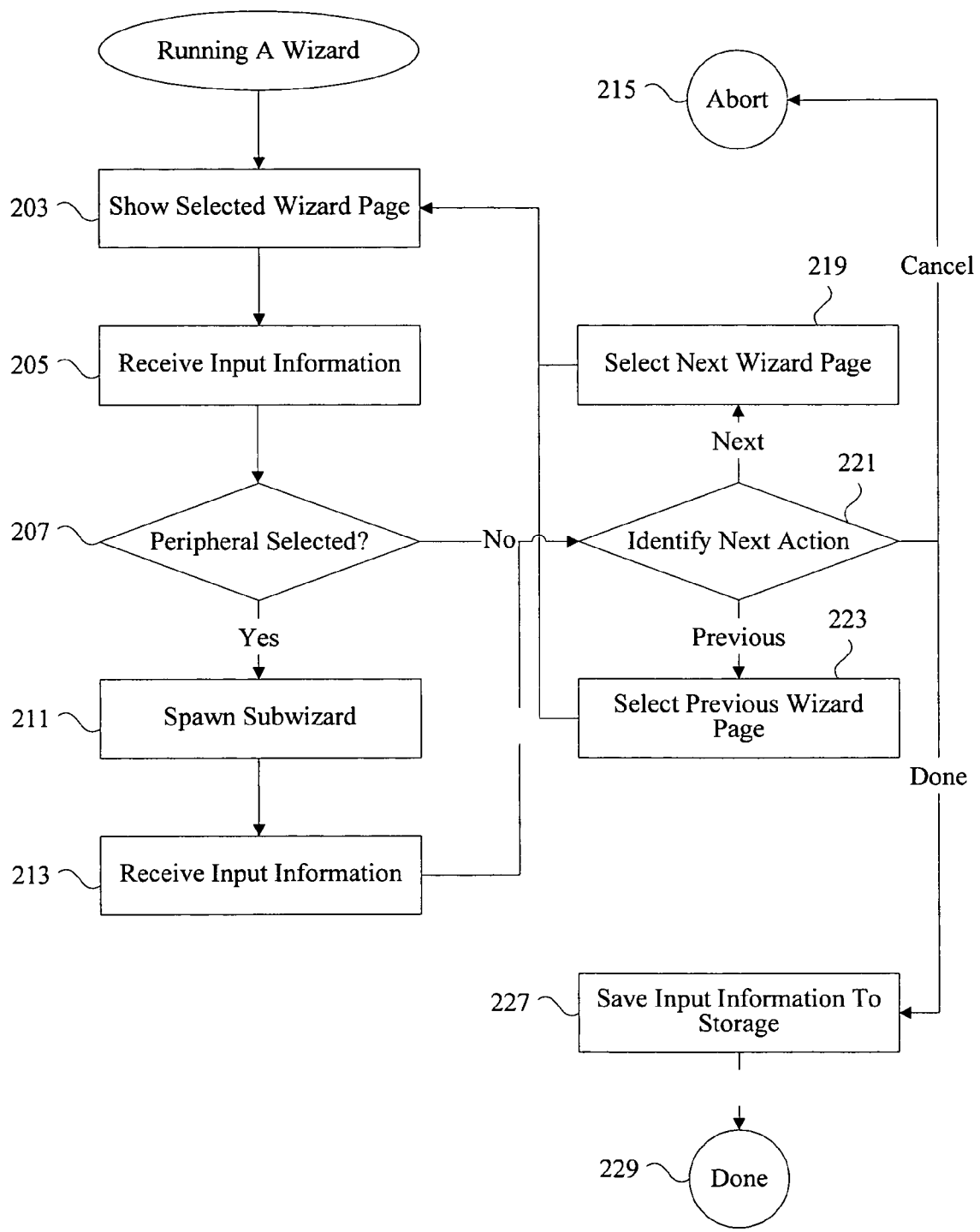
FIG. 2 is a process flow diagram depicting an input interface using a wizard.

FIG. 2 is a process flow diagram showing a wizard that can be used to implement input stage 101 of FIG. 1. Wizards generally comprise of a sequence of pages. Each page can present the user with content information and questions. Each page may also include input mechanisms such as check boxes, radio button groups, drop-down selection lists, or entry spaces. Each wizard page may include standard navigation buttons to allow a user to select a next page, a previous page, finish, or abort the wizard entirely.

At 203, a selected wizard page is shown to a user. At 205, a wizard may receive input information from a user who has selected various items on drop-down lists or marked various check boxes. The information can be used to later generate a logic description for implementing a programmable chip. Some of the items that the user may select are peripheral components and peripheral interfaces. For example, a user may select to implement a UART component and an SRAM interface. According to various embodiments, if a peripheral such as a peripheral component or a peripheral interface is selected at 207, a subwizard is spawned at 211. A subwizard can be another sequence of pages containing content, queries, and input mechanisms. A subwizard can be similar to a wizard. Each page of a subwizard can allow a user to enter or parameters associated with a selected peripheral such as a UART.

In one example, a user selects a UART on a wizard page. The wizard then spawns a subwizard at 213 to accept parameter information for the UART. According to various embodiments, a subwizard is a separate window from the window used to show the wizard. A sequence of subwizard pages can then be viewed by a user to allow parameterization of the UART. According to various embodiments, subwizards can themselves spawn other subwizards. Subwizards and wizards can be arranged to allow efficient and convenient entry of user selections and parameters. According to other embodiments, a subwizard is not spawned when a peripheral is selected. The selection of a peripheral may instead simply add the selected parameterized peripheral to the design.

If a wizard is not selected, a user action is identified at 221. The user may select a next page for viewing at 219, return to a prior page at 223, exit the wizard at 215, or selected finish. If the user selects finish, the information input by the user can be saved to storage at 227. According to various embodiments, the user input is saved to an ASCII based file such as a PTF file. As noted above, Appendix A shows one example of a PTF file.

As will be appreciated by one of skill the art, various arrangements of content and entry mechanisms can be used to receive user selections and parameters. In one embodiment, a set of wizard pages can be replaced by a single form that can be filled in with information about various peripherals, peripheral parameters, processor cores, processor core parameters, etc. According to other embodiments, a wizard may have additional navigation buttons to allow a user to jump to a particular page.

Figure 3A:
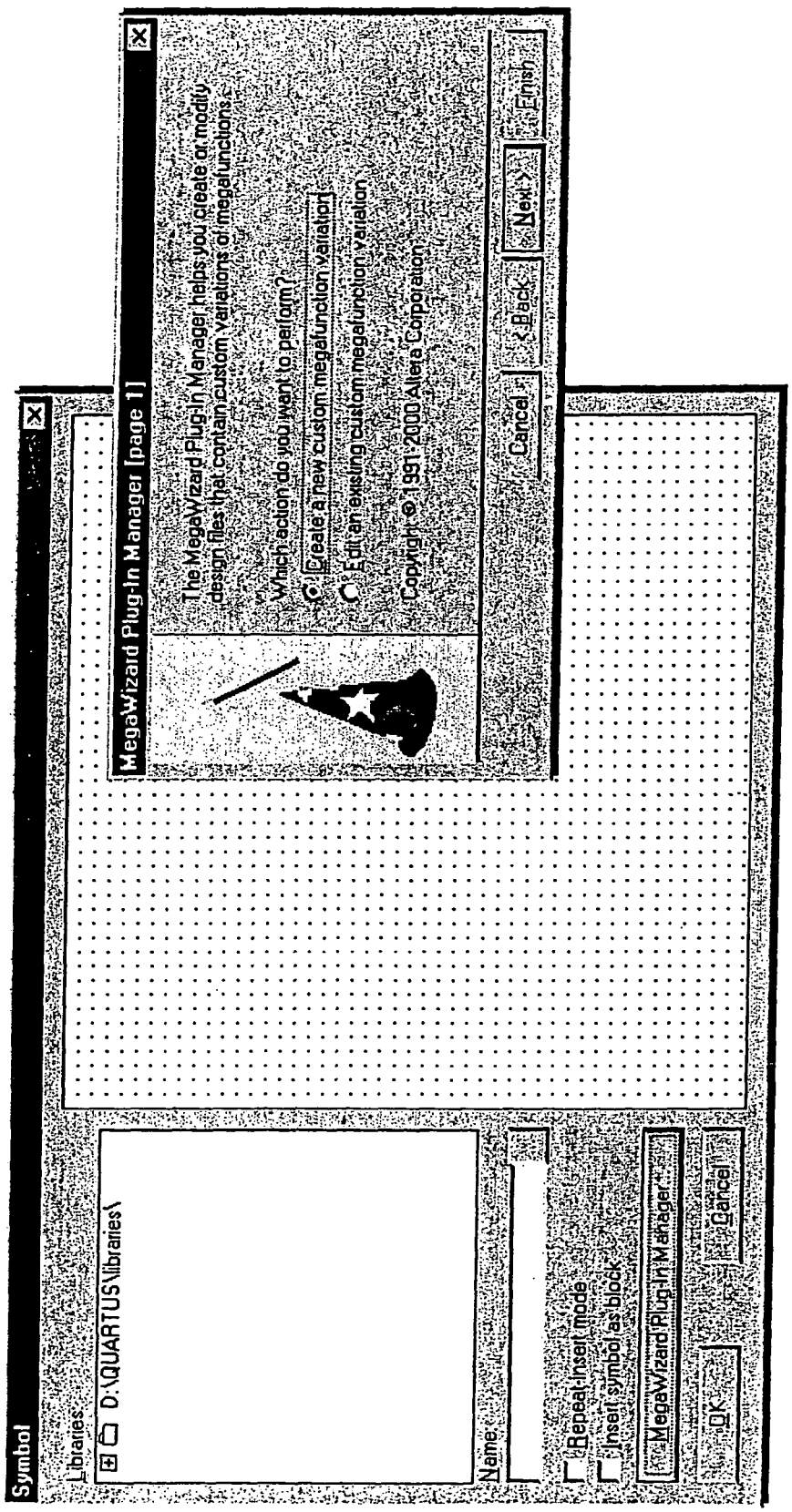
FIGS. 3A-3U are diagrammatic representations of wizards that can be used to configure the core and peripherals.

FIGS. 3A-3Z are examples of wizard pages and subwizard pages that can be used to select processor cores and peripherals. Many different processor cores and peripherals are available. An example of a processor core is the Nios 32-bit RISC CPU available from Altera Corporation, San Jose, Calif. Architectures for various RISC processor cores will be appreciated by one of skill in the art. Some examples of peripherals are UARTS, timers, serial peripheral interfaces (SPI), parallel I/O (PIO), memory interfaces, generic port interfaces, and on-chip buses. As will be appreciated by one of skill in the art, a variety of different processor cores and peripherals in addition to the ones provided can be implemented on a programmable chip.

Figure 3B:
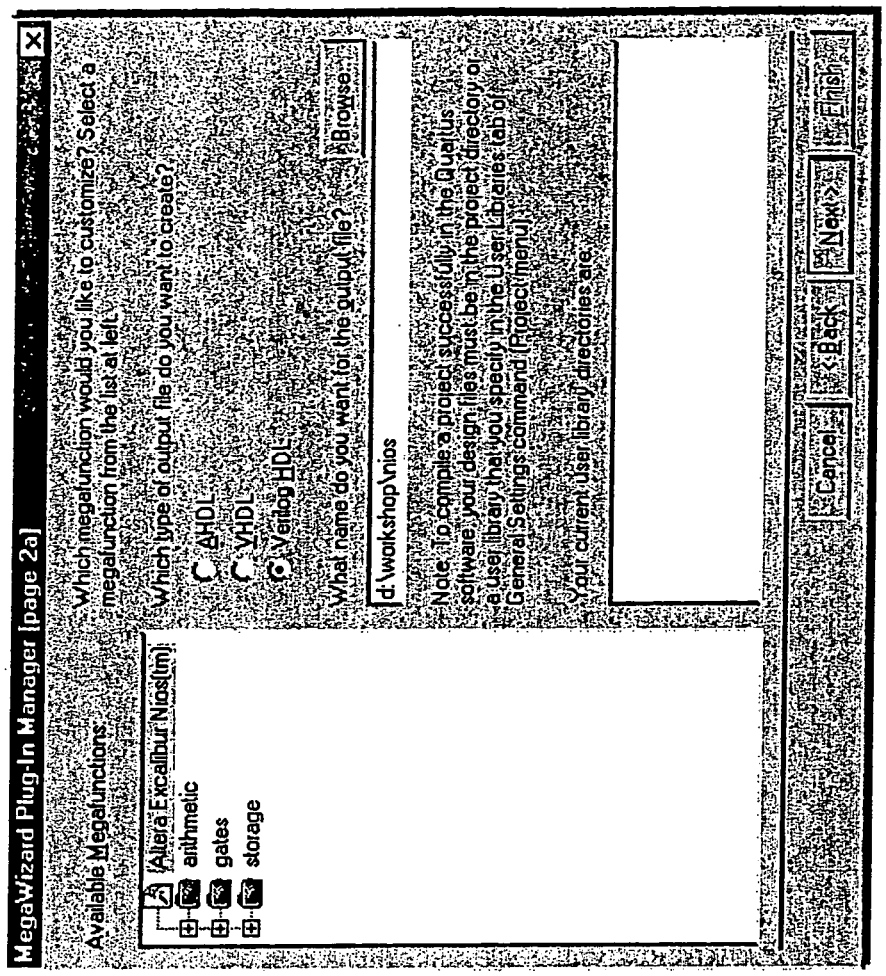
FIG. 3V is a diagrammatic representation of a structure that can provide information to the wizard.
Figure 3C:
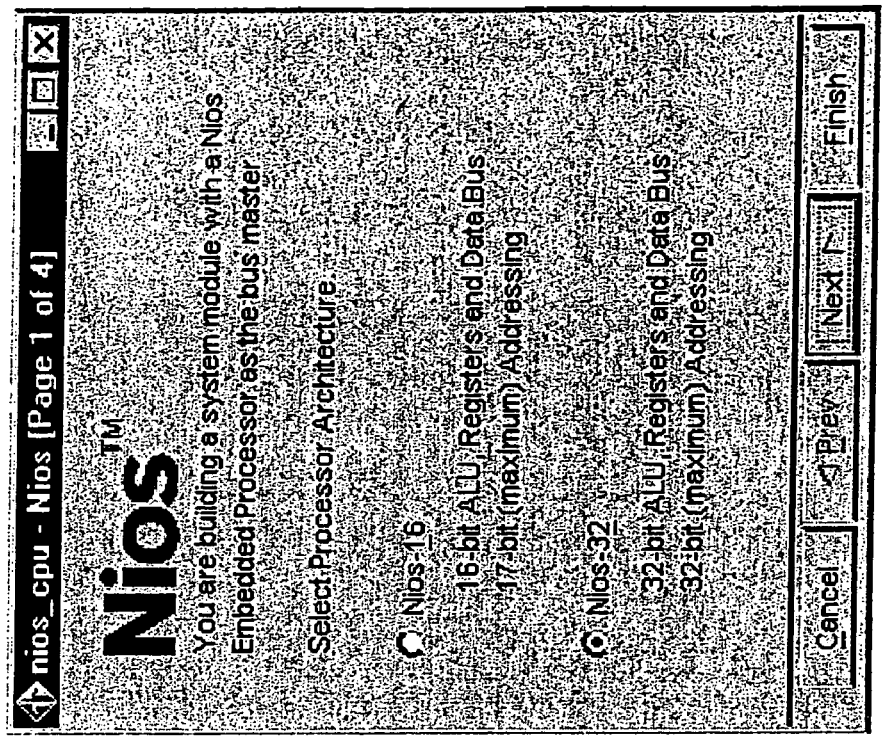
Figure 3D:
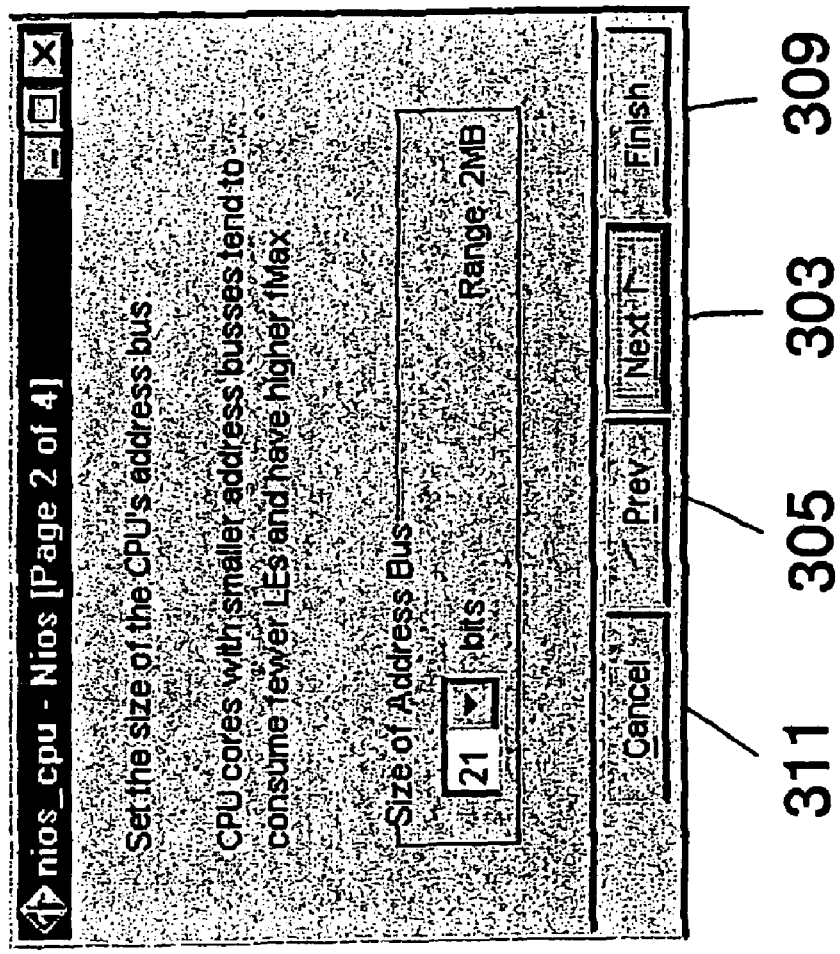

FIG. 3A shows a wizard page allowing a user to select between creating a new logic description or editing an existing logic description. Editing an existing logic description can save time while creating a new logic description provides the user with flexibility. FIG. 3B allows users to select what type of logic description to create. Some options listed are AHDL, VHDL, and Verilog. FIG. 3C is a wizard page allowing a user to parameterize a Nios processor core. The user can select a 32-bit or a 16-bit architecture. As will be appreciated by one of skill the art, a 32-bit architecture can typically perform processing more quickly than a 16-bit architecture. However, a 32-bit processor core may use more limited programmable logic on a programmable chip. FIG. 3D allows a user to select the size of the address bus associated with the processor core.

Figure 3E:
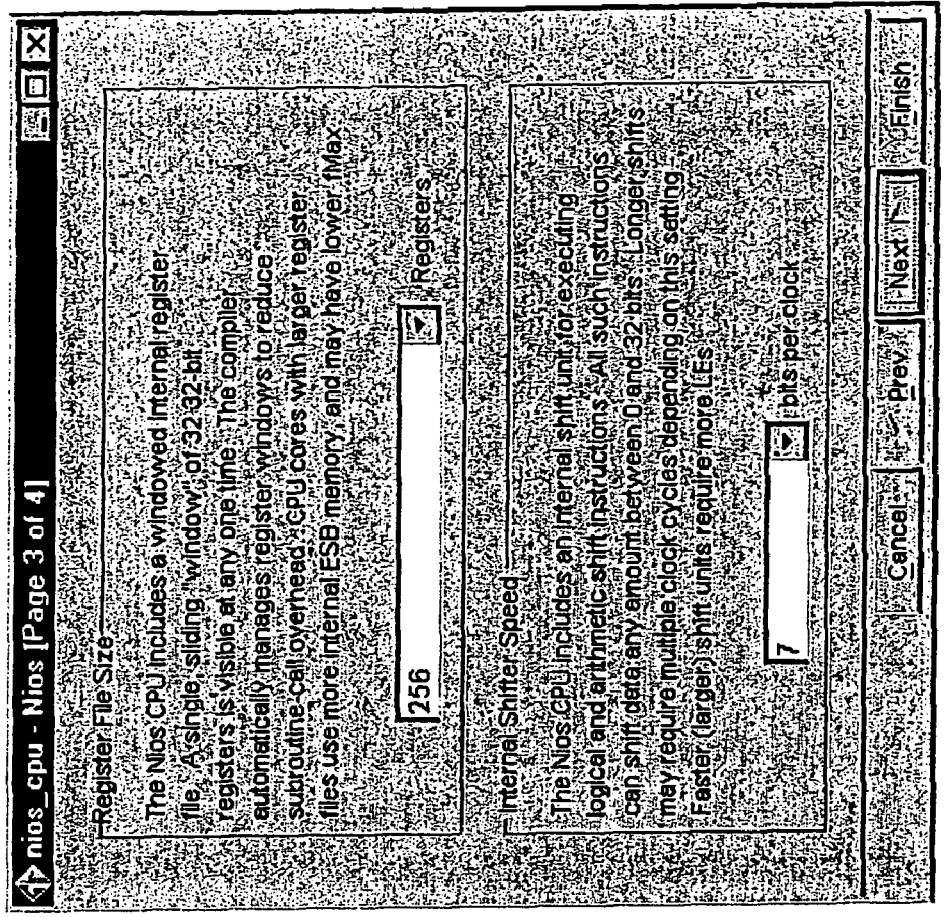
Figure 3F:
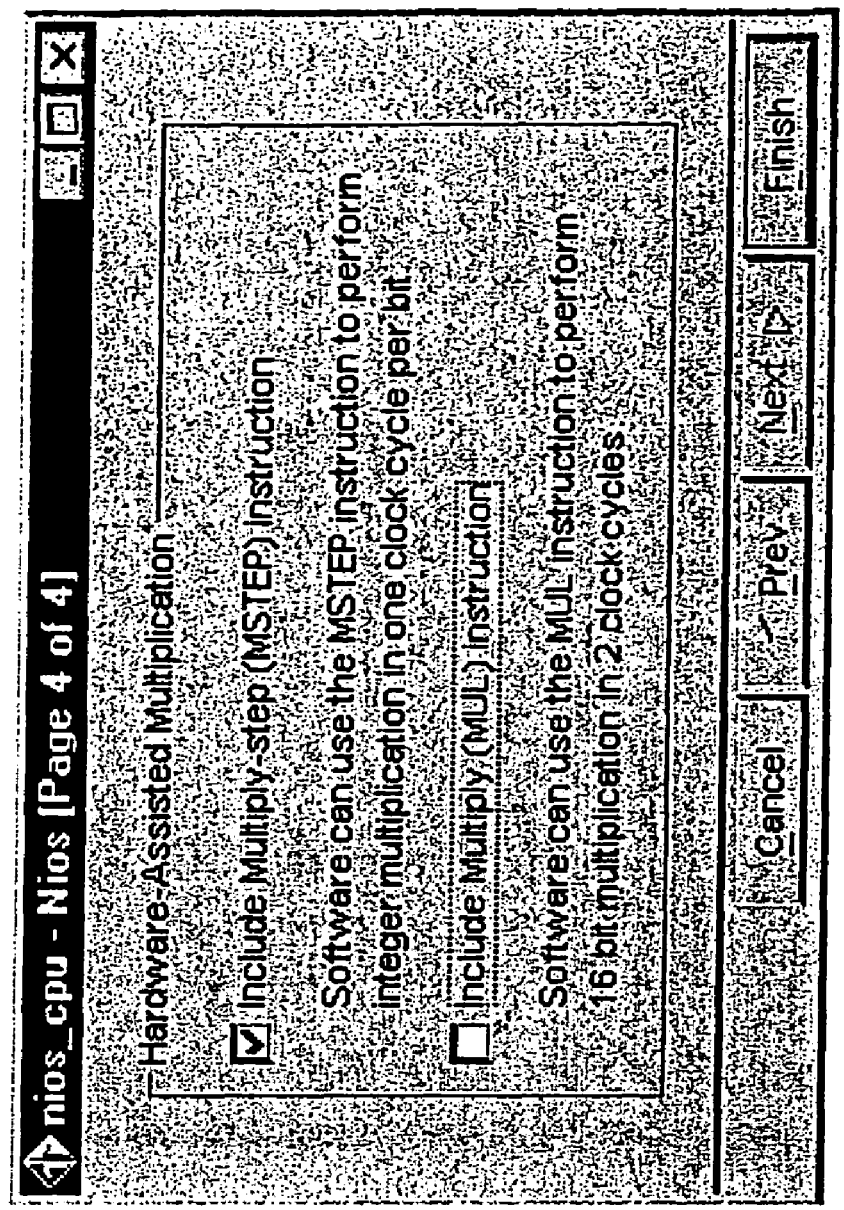
Figure 3G:
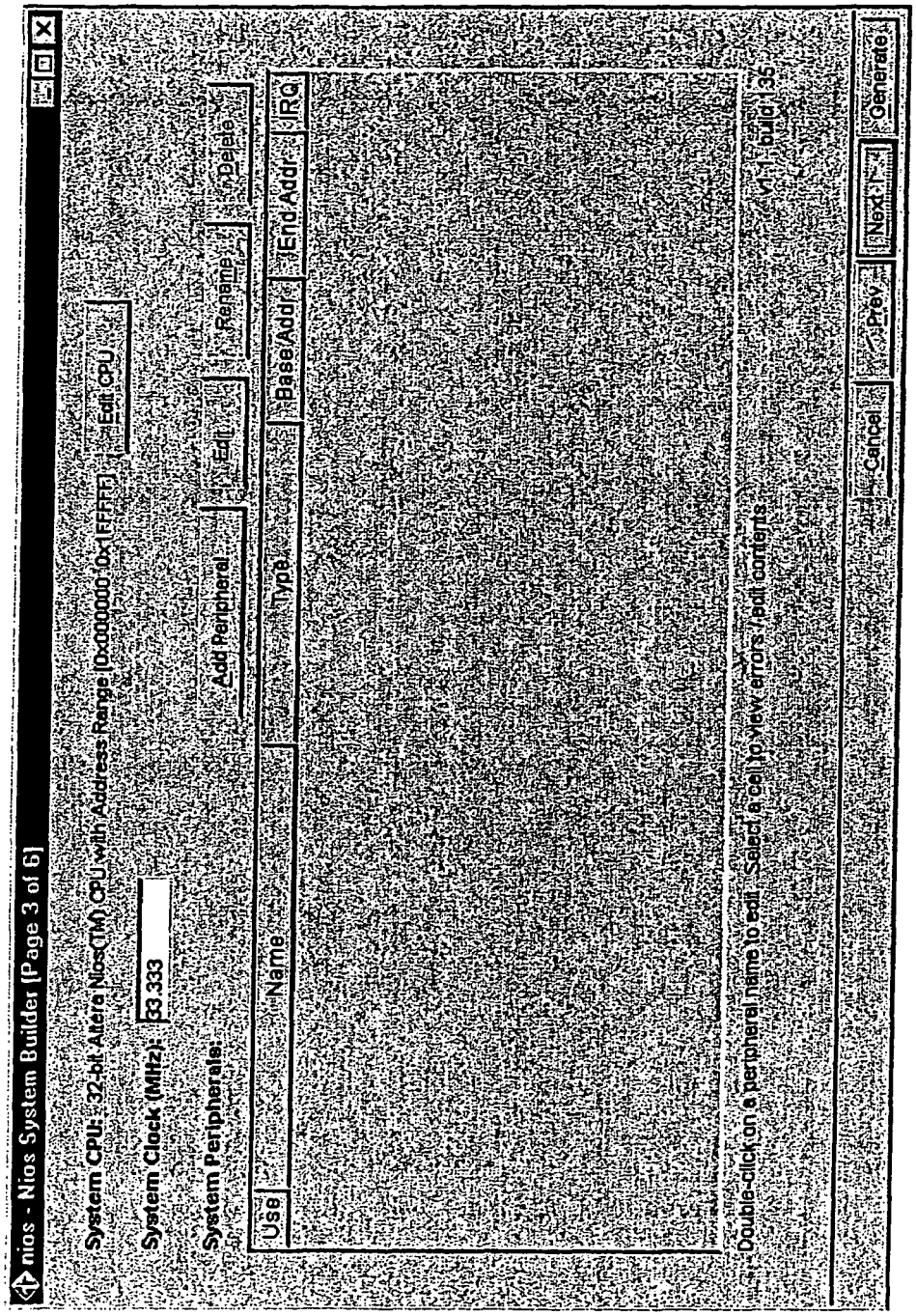

It should be noted that each wizard page can have a next button 303, a previous button 305, a finish button 309, and a cancel button 311. The buttons allow a user to select a next wizard page, a previous wizard page, complete information entry, or abort the wizard entirely. FIG. 3E allows a user to select the number of registers in a processor core as well as the speed of the internal shifter. Many of the selections are based on tradeoffs between speed, efficiency, and conservation of logic on a programmable chip. Selections allowing faster or more accurate processing typically use more logic. FIG. 3F allows a user to select whether to include a multiplier in the processor core. As will be appreciated by one of skill the art, a multiplier can speed up any multiplication instruction. However, a multiplier uses a significant amount of logic. Without a multiplier, multiplication can be performed using repeated addition to conserve logic on the programmable chip. FIG. 3G is a wizard page that allows a user to select the clock rate of the Nios processor core. FIG. 3G can serve as a branch point 207 for spawning subwizards at 211 through the use of the "add peripheral" button.

Figure 3H:
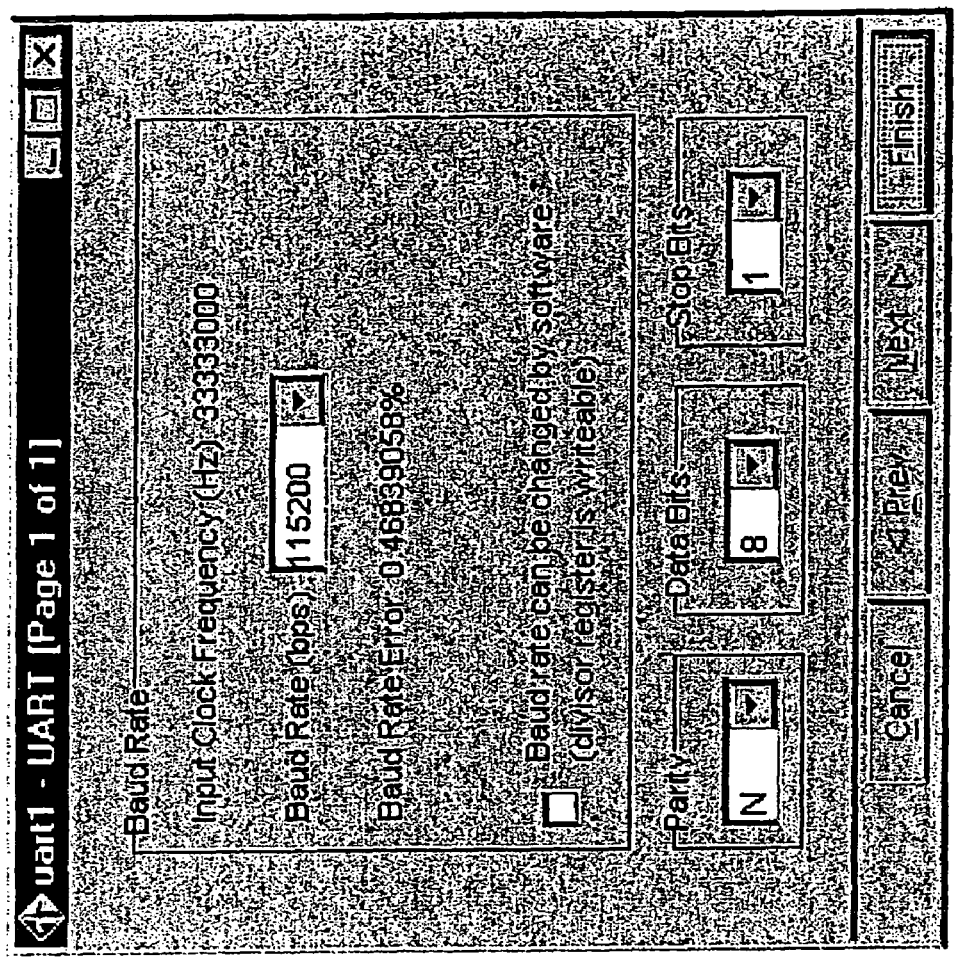
Figure 3I:
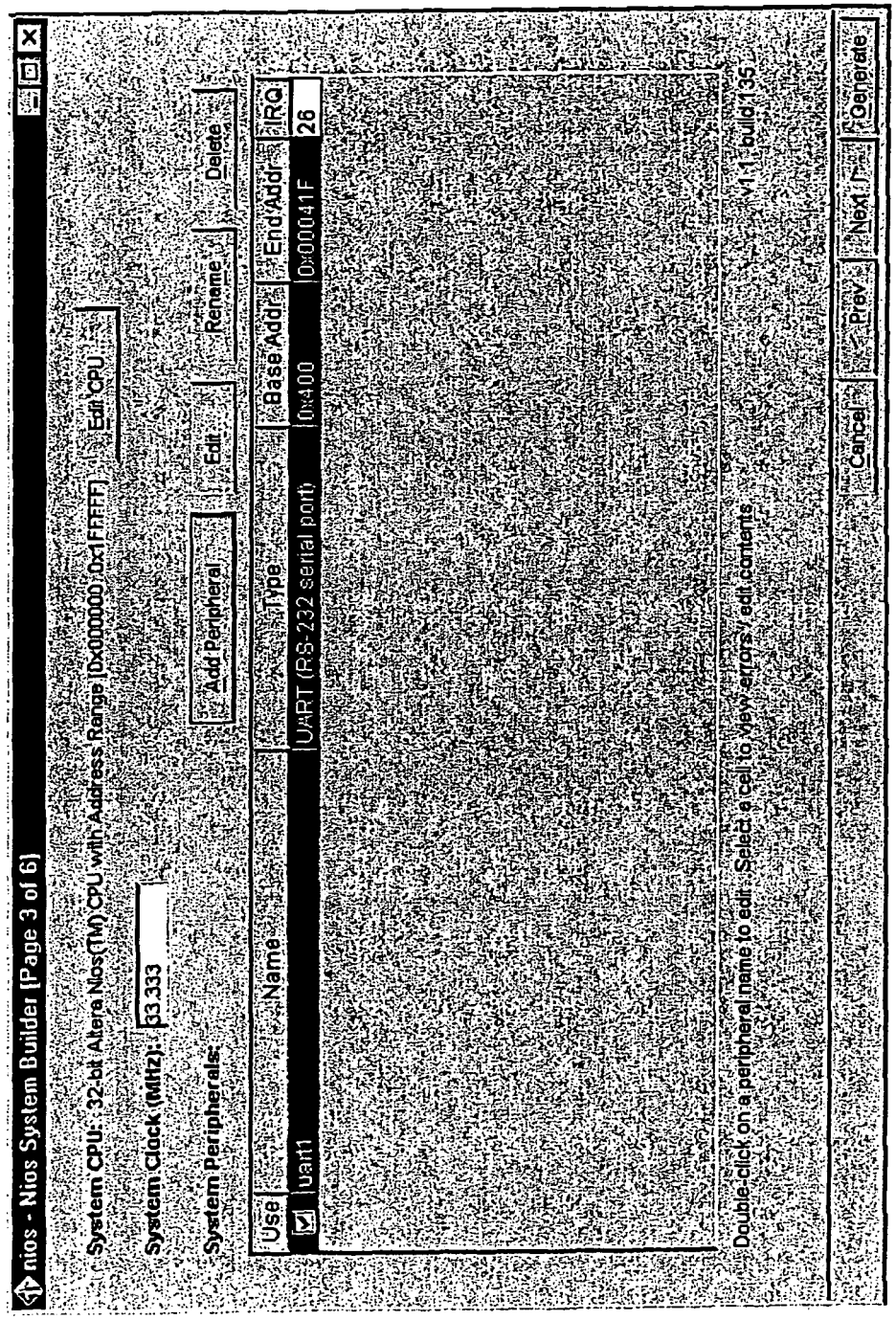
Figure 3J:
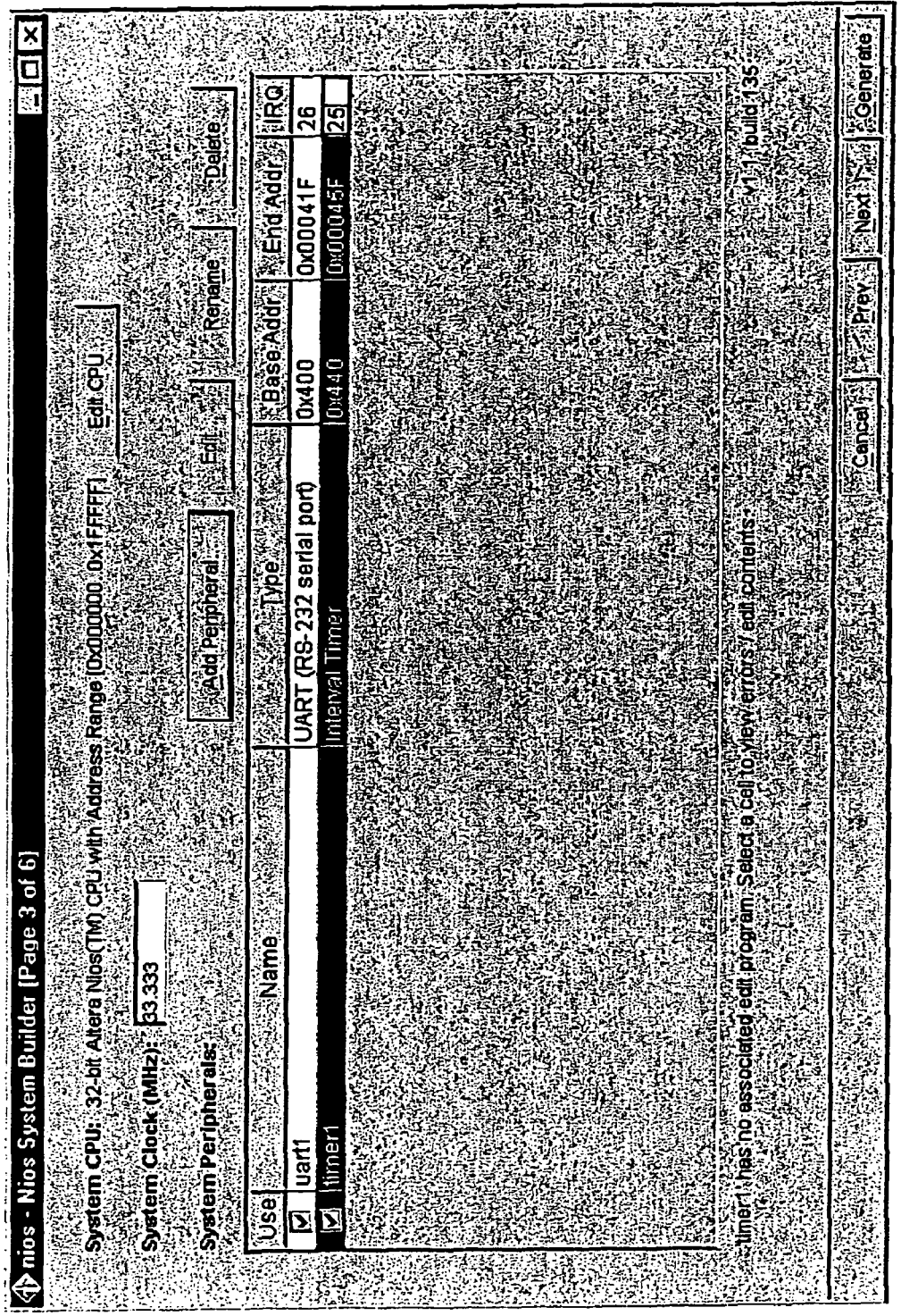
Figure 3K:
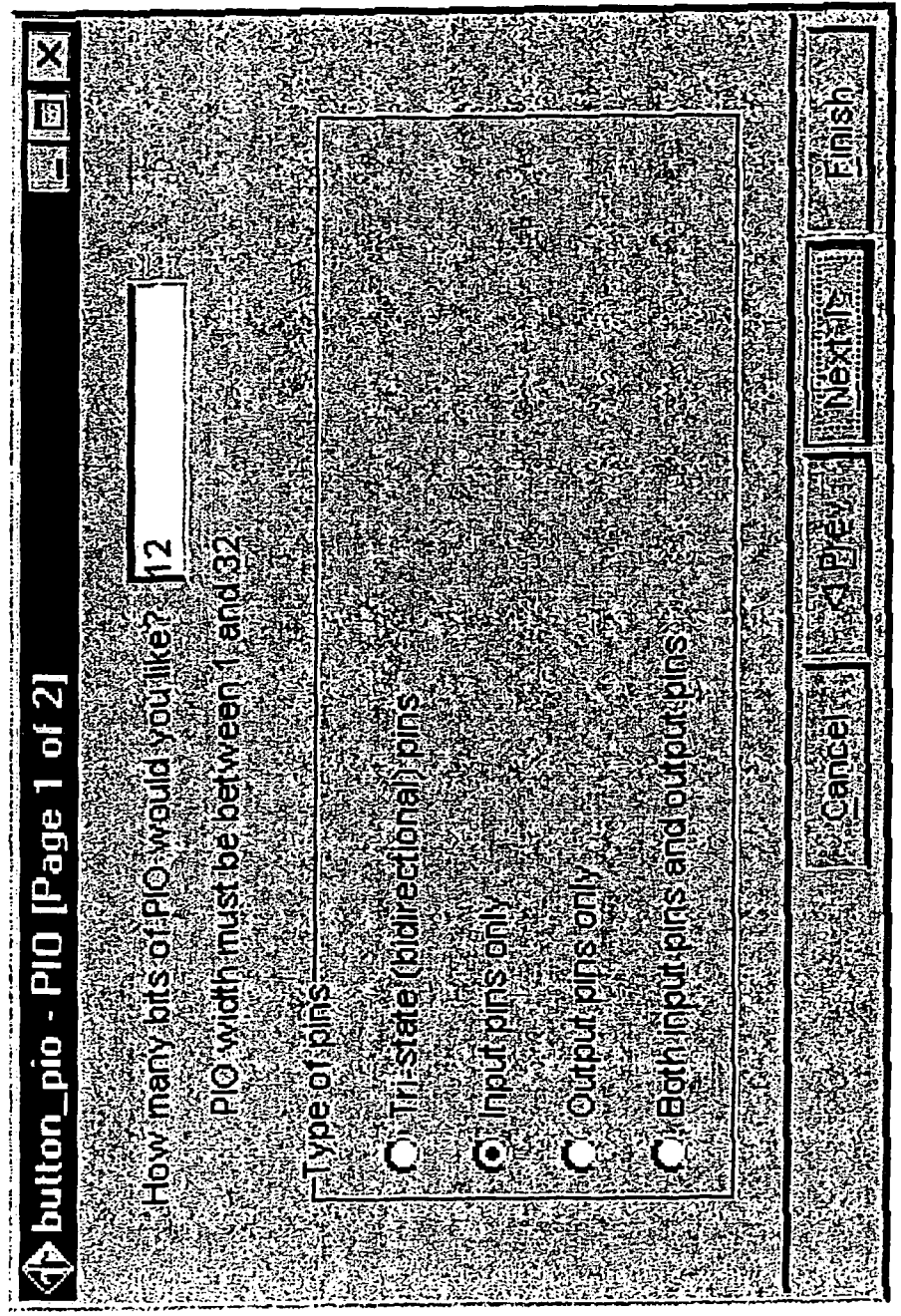
Figure 3L:
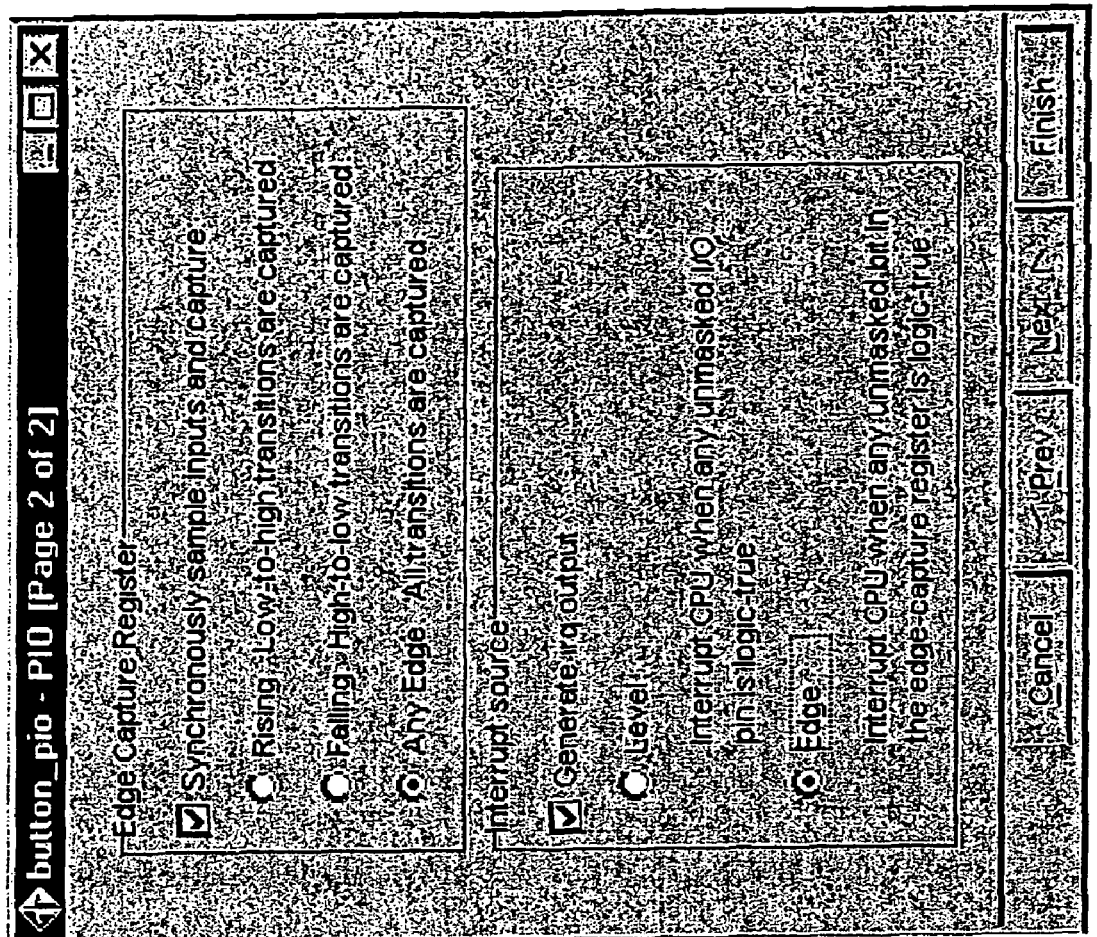
Figure 3M:
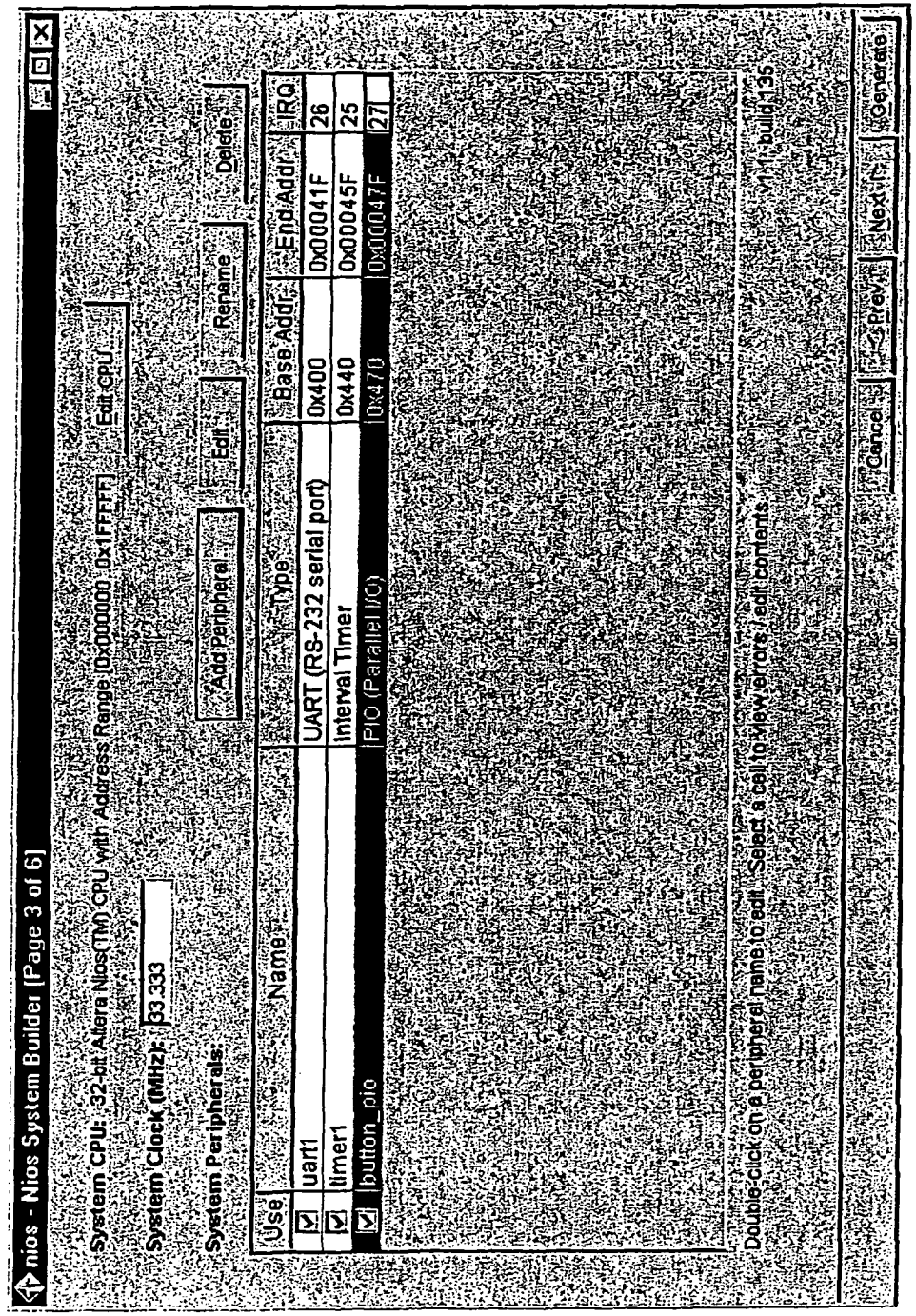
Figure 3N:
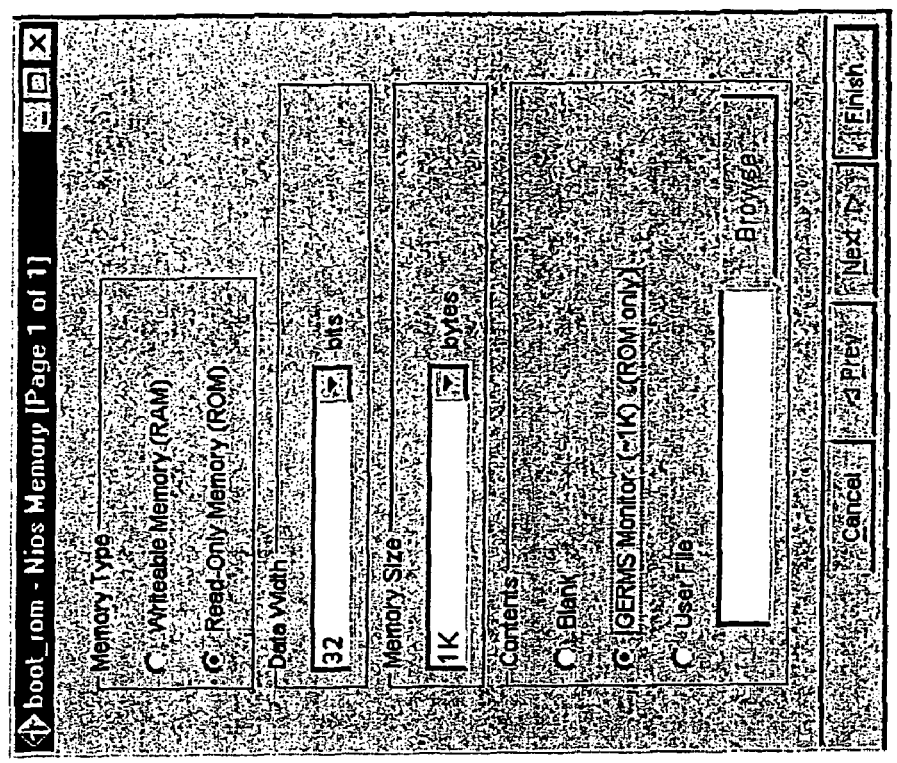
Figure 30:
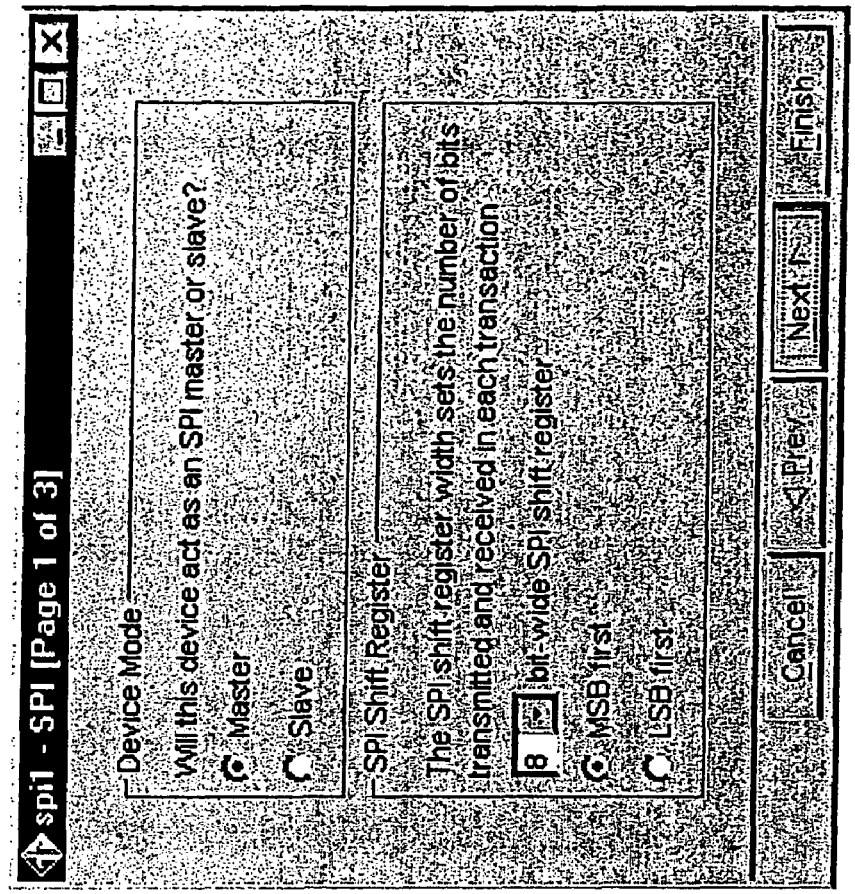
Figure 3P:
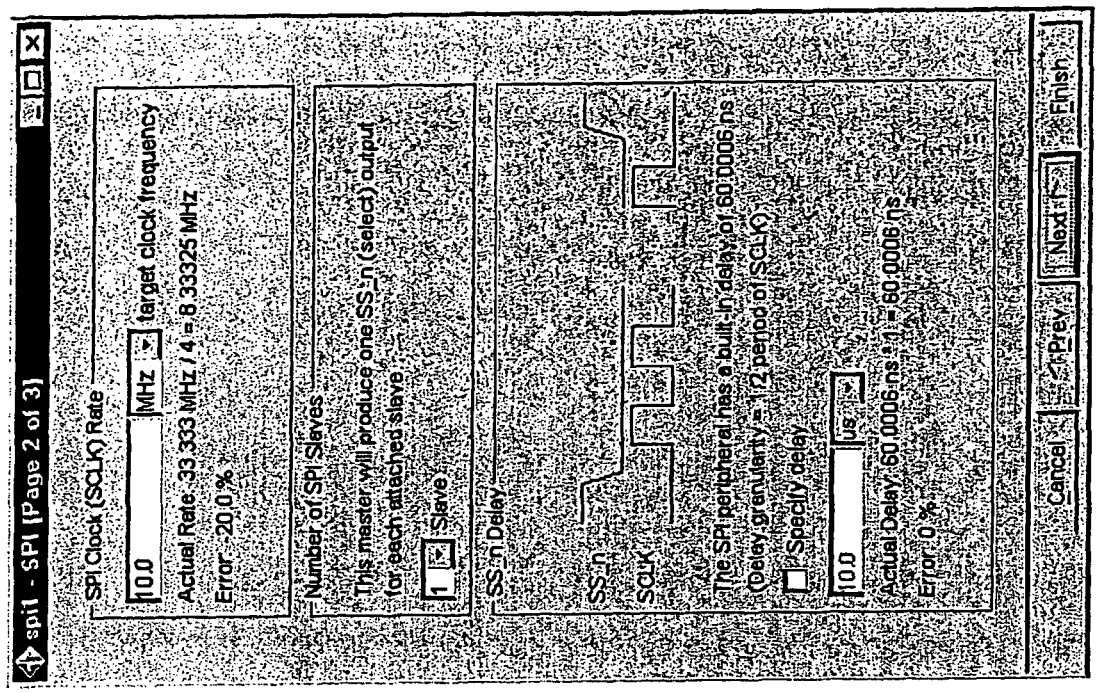
Figure 3Q:
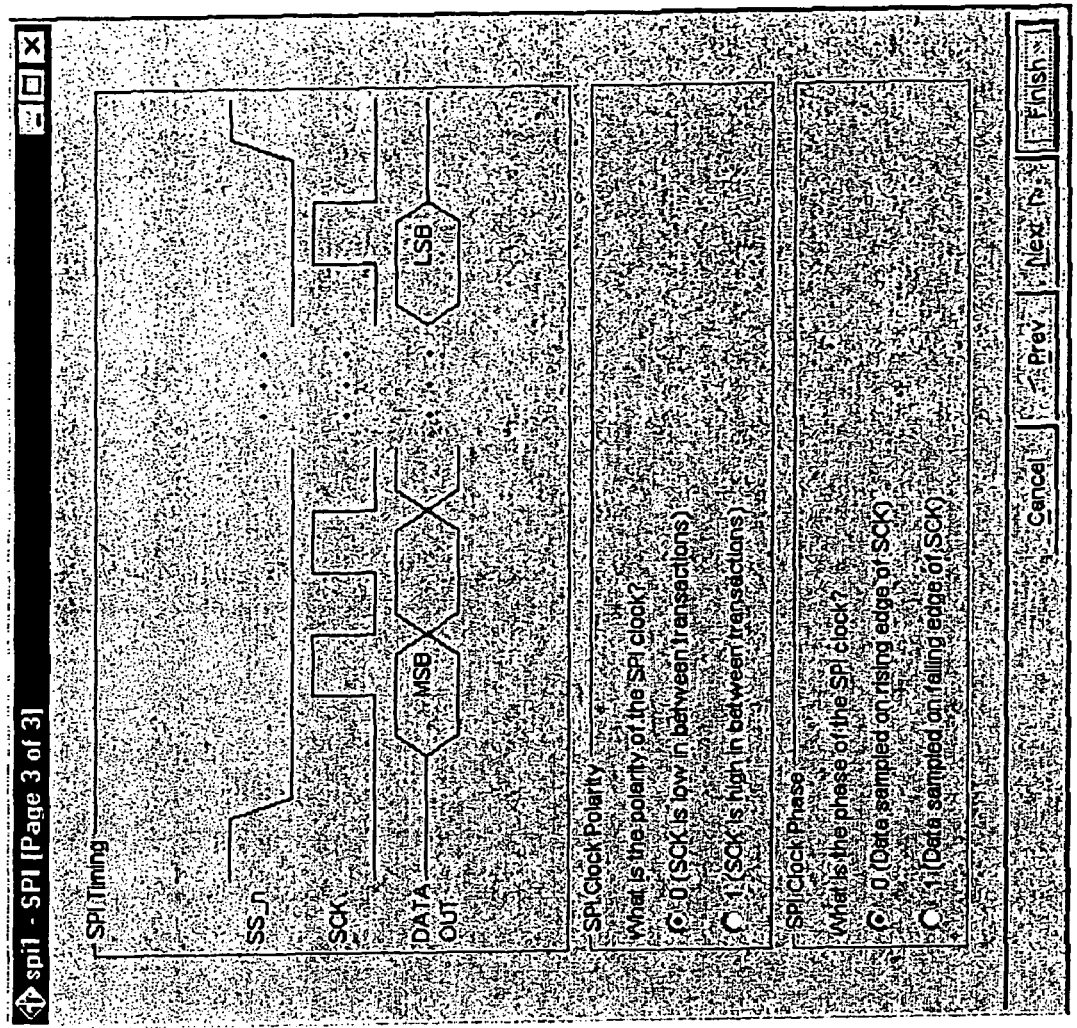

The wizard pages allow parameterization of a processor core as well as the addition and parameterization of peripherals. FIG. 3H shows a wizard page for allowing the addition of a peripheral. The wizard shown in FIG. 3H may simply be a wizard page or it may be a subwizard page spawned by a wizard page. FIG. 3H allows the selection of a baud rate for a UART as well as the setting of parity, data, and stop bits. FIG. 3I is a wizard or subwizard page allowing the user to set the UART base address and IRQ. FIG. 3J is a page allowing the parameterization of a timer. FIG. 3K is a page allowing the parameterization of a parallel input output interface. FIG. 3L allows a user to select when an interrupt associated with the parallel input output should be generated. FIG. 3M allows the setting of base address and IRQ priority for the parallel input output. FIG. 3N is a wizard page allowing the parameterization of memory. The memory type can be set as read-only memory. The data width may be set to 32 bits. The memory size can be set to 1k. FIG. 3O shows the parameterization of a serial peripheral interface. It should be noted that peripheral components and peripheral interfaces as well as processor cores can all be parameterized. FIGS. 3P and 3Q allow further configuration of the serial peripheral interface.

Figure 3R:
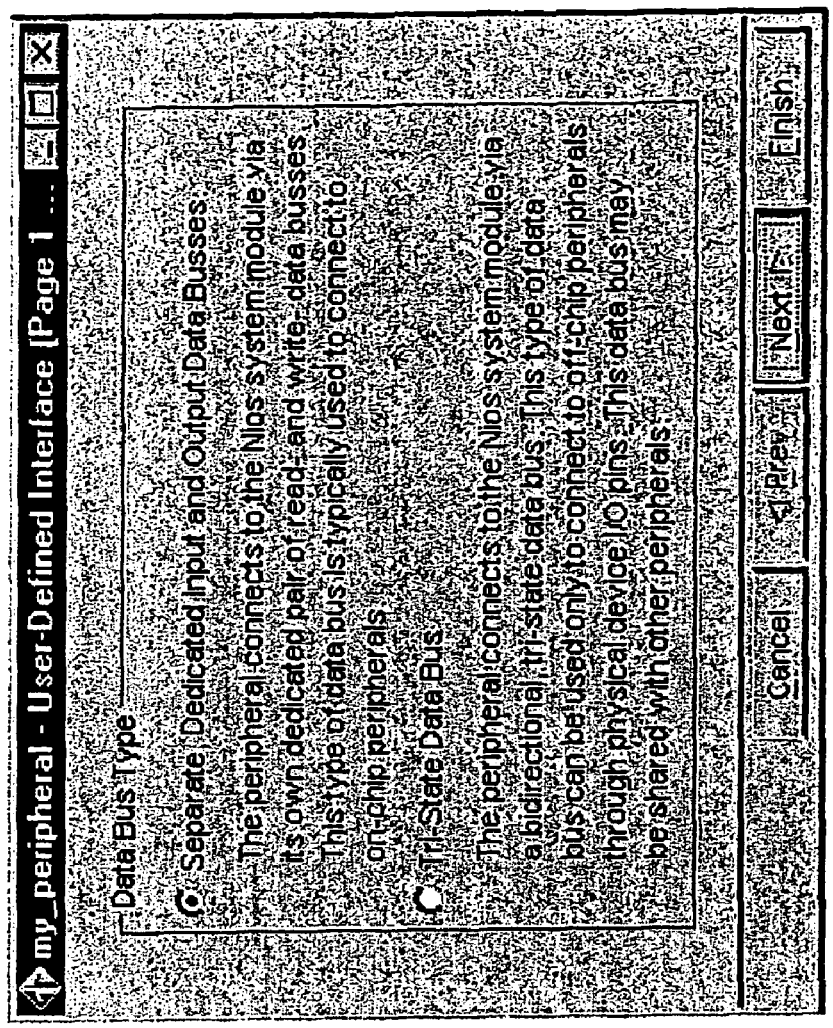
Figure 3S:
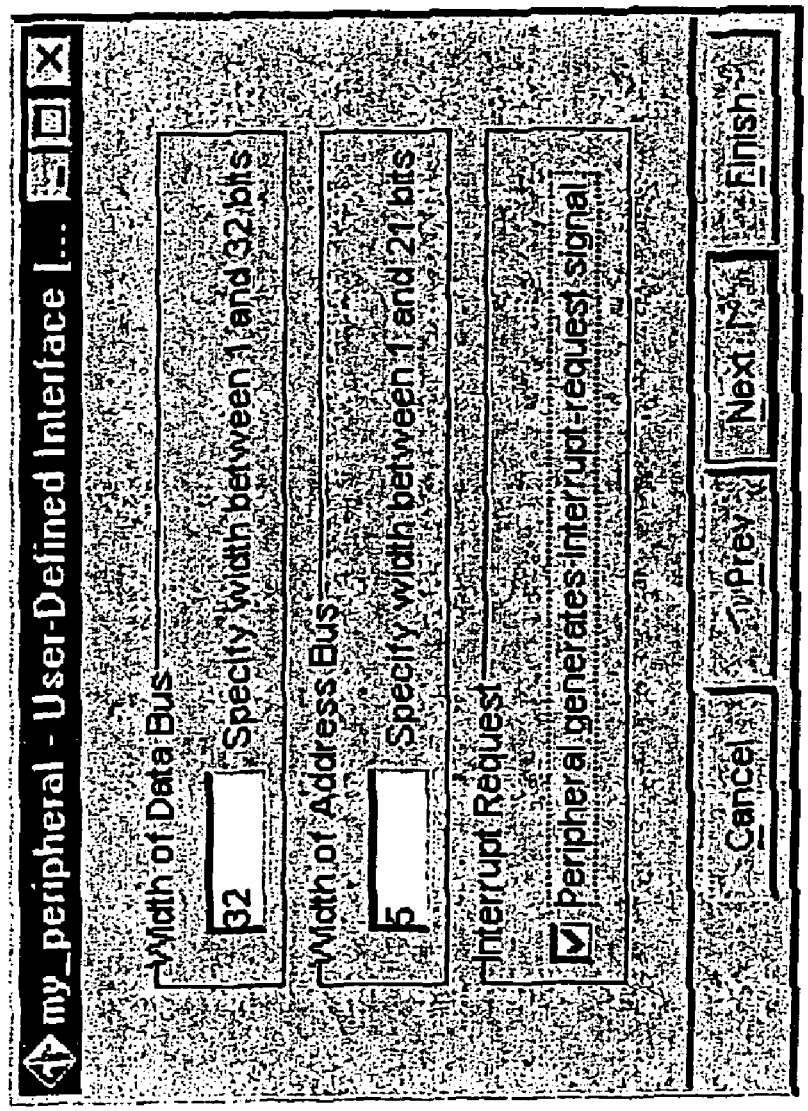
Figure 3T:
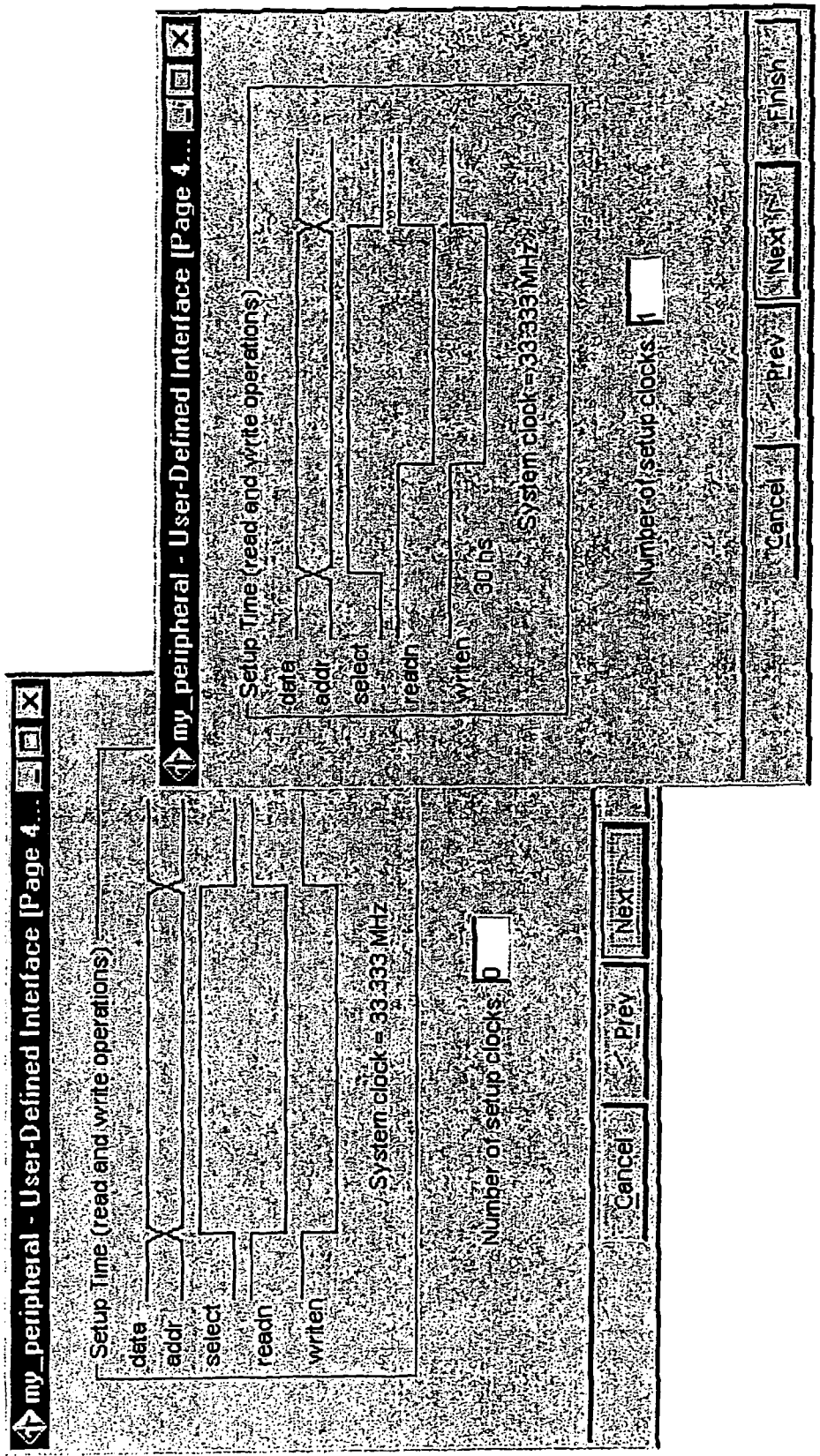
Figure 3U:
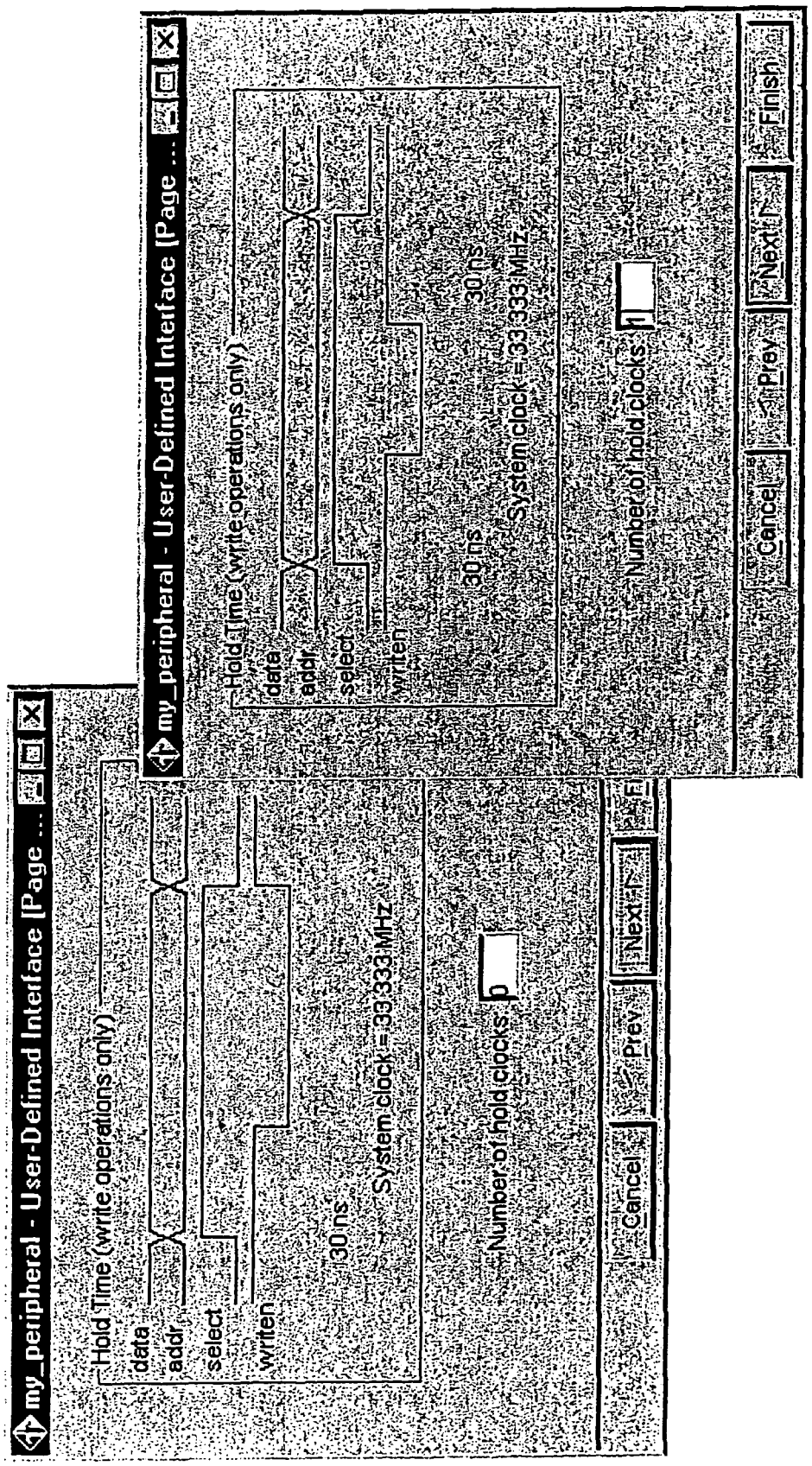

A user can also select to custom design a peripheral using various wizard pages. FIG. 3R allows the user to specify what type of bus should be used to connect a user defined peripheral. FIG. 3S allows a user to specify the width of the data bus, the width of the address bus, and whether the peripheral user defined peripheral generates an interrupt. FIGS. 3T and 3U allow a user to configure the number of set up clocks and hold clocks.

As will be appreciated by one of skill the art, a variety of standard, user defined, third party, and custom peripherals and processor cores can be selected and parameterized using the wizards shown in FIGS. 3A-3U.

Figure 3V:
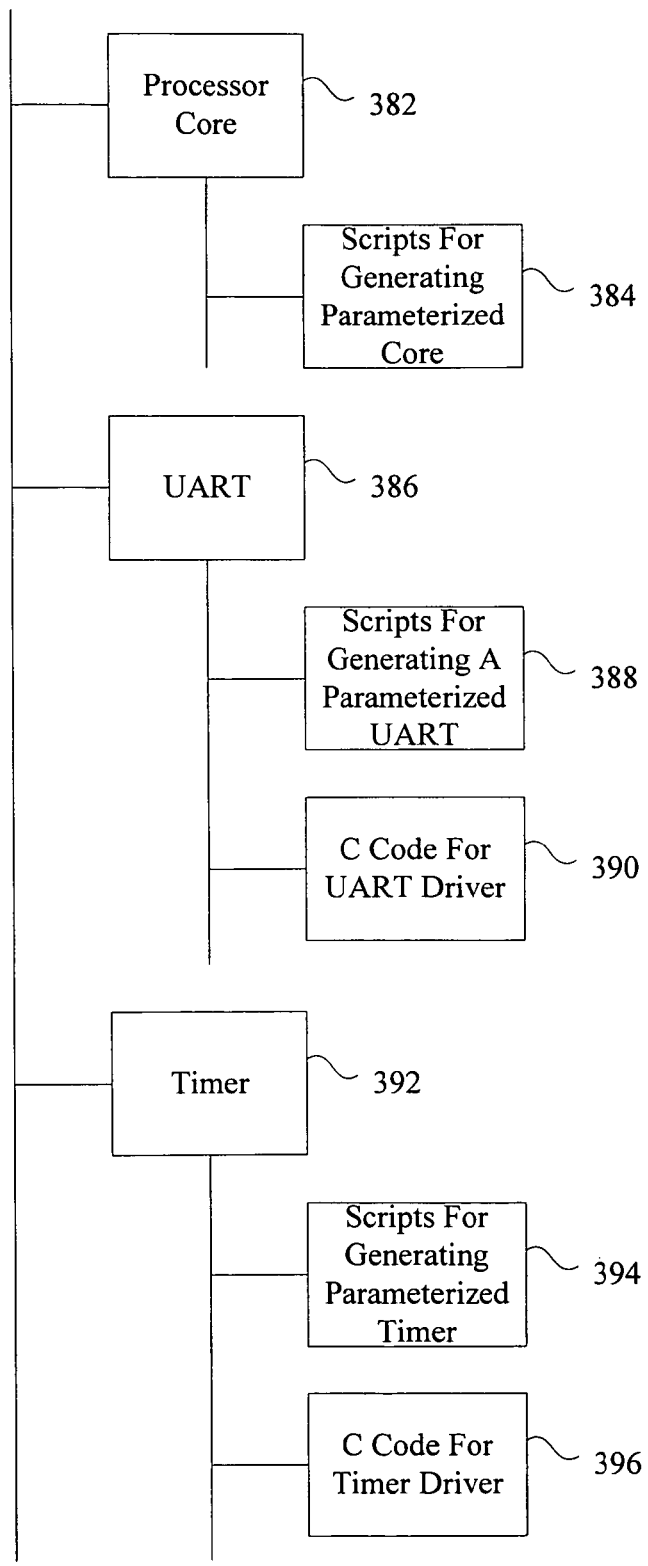

FIG. 3V is a diagrammatic representation of a directory structure that can hold files accessible by the wizards. A library, database, or file server can contain information for generating processor cores and peripherals. In one example, a library contains a processor core directory 382 containing a subdirectory with scripts for generating the parameterized processor core at 385. The library may also contain a folder containing UART module 386. Subdirectories of the UART directory 386 can contain scripts for generating a UART at 388 and C code for UART drivers at 390. The library may also contain a timer module folder 392. Subdirectories of the timer module folder 392 may include subdirectory the 394 containing scripts for generating a parameterized timer and subdirectory 396 containing C code for a timer driver. It should be noted that the file structure shown in FIG. 3V is one example of a library or database that can provide information to a wizard for generating parameterized processor cores and peripherals with embedded device driver logic. According to various embodiments, information for generating a UART module or a parameterized timer module may be accessed over a network.

Figure 4:
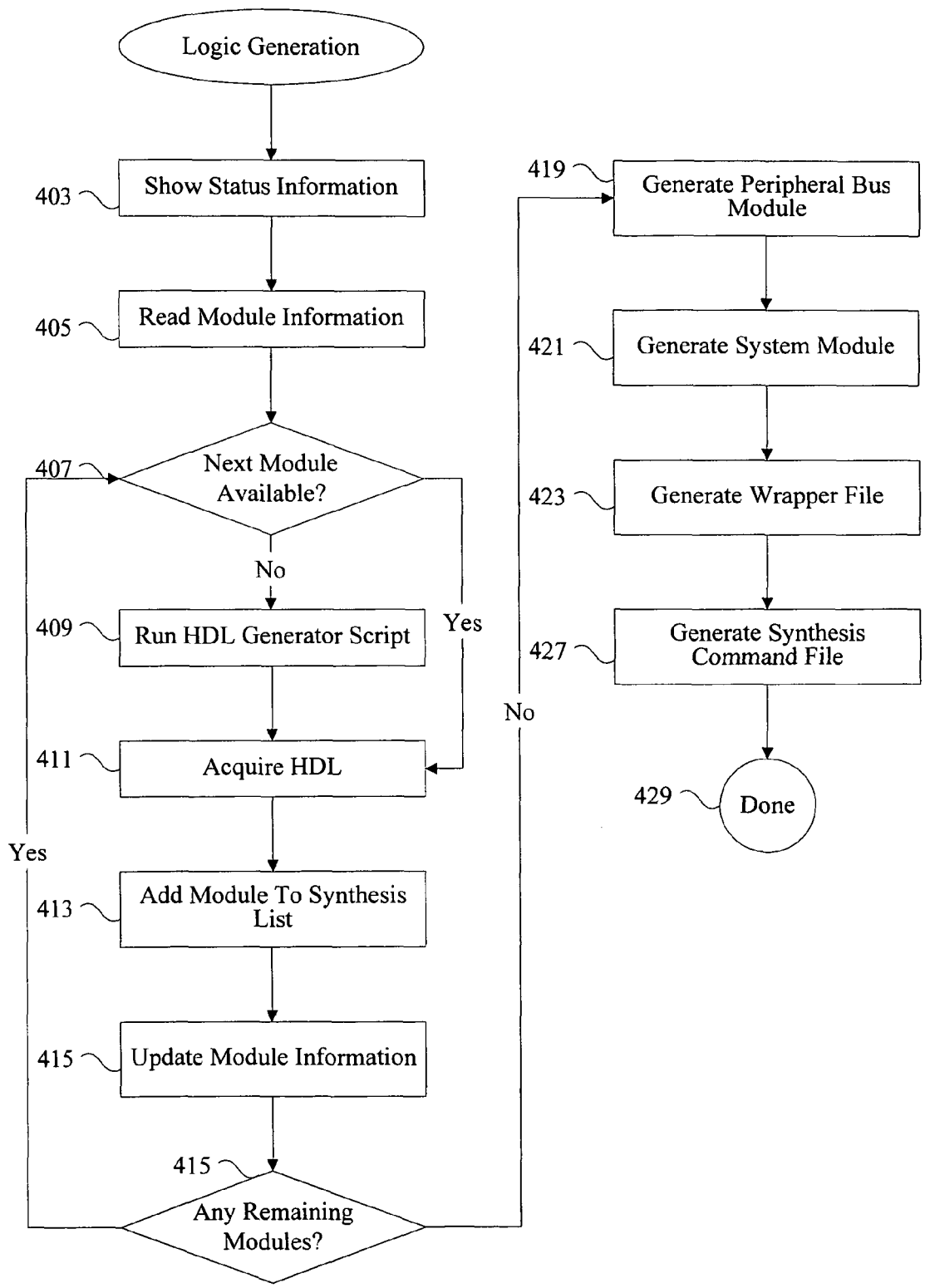
FIG. 4 is a process flow diagram of a logic generation process.

The wizards can use the scripts and C code to provide information to a generator program. FIG. 4 is a process flow diagram of a generation program that can be used to receive input information. At 403, a console can be launched to show status information. The console can provide information about the events occurring during the running of the generation program. In one example, the console can show when the generation program believes it has received invalid input from the input stage. According to various embodiments, module information is read at 405. Reading module information may comprise reading information about peripheral components, peripheral interfaces, and processor cores in a PTF file. According to other embodiments, reading module information may comprise receive information directly from a user.

In one embodiment, a PTF file may contain information identifying modules such as a RISC processor core, UART, and a timer. Parameter information associated with the modules may indicate that the RISC processor core is 16-bit, the UART has a baud rate of 115,200 bps, and the timer is a 4-bit timer.

The generator program then determines if the next module read from the PTF file is available at 407. According to various embodiments, a module is available if an associated HDL file is in the module library. In one example, the generator program checks to determine whether an HDL file for a 4-bit timer is available in the module library or database. If an HDL file is available, the logic description can be acquired at 411.

If the HDL file is unavailable, the logic description (e.g. an HDL file), can be dynamically generated. In one example, dynamically generating an HDL file provides tremendous flexibility in allowing a variety of different processors and peripherals with a variety of different parameters. Dynamically generating an HDL file also allows delivery of a device driver as embedded logic in a particular peripheral. It should be noted however, that device driver logic can be delivered even when processor cores and peripherals are not dynamically generated. According to various embodiments, a general-purpose programming language can be used to create a custom HDL file with a very particular parameter set and a device driver tailored to the selected processor core. Conventional hardware description languages such as Verilog or VHDL only allow very limited parameterization of various modules. Verilog allows only simple parameter substitution. VHDL, although allowing more parameterization, can not practically be used for extensive parameterization of various modules. VHDL, like many hardware description languages, was designed primarily for simulation, and not for design entry and synthesis.

Dynamically generating HDL files, on the other hand, allows extensive parameterization as well as delivery of device driver logic for a processor core/peripheral system. According to one embodiment, a general-purpose programming language such as Perl, C, C++, or Pascal can be used to generate the customized HDL file. The general-purpose programming language can interpret information about user selected processor cores and peripherals as well as their associated parameters and generate corresponding logic in an HDL file. If it is determined that a module is not available at 407, an HDL generator script can be run at 409 to create a customized HDL file for the particular processor core or peripheral. The Perl programming language provides extensive functionality for text manipulation and translation. In one example, a Perl script can be used to translate user selected parameters and device driver information into HDL. An example of a program for dynamically generating HDL is provided in Appendix B. Appendix B also contains files for implementing a generator program.

As will be appreciated by one of skill of the art, dynamically generating modules may comprise parameterizing already generated modules. A variety of different modules are often available from third parties for implementation on a programmable chip. These modules may be provided in a variety of formats. For example, Altera Corporation of San Jose, Calif. provides modules referred to as malfunctions and megacores in encrypted netlist format. Dynamically generating modules may comprise parameterizing already existing megafunctions and megacores. Dynamically generating a logic description associated with parameterized processor cores and peripherals provides information for implementing a programmable chip.

Dynamically generating HDL files not only allows for parameterized processor cores and peripherals with embedded device driver logic, it also allows for the implementation of user-defined or third party processor cores and peripherals. Many conventional systems only allow implementation of modules with HDL files specified in a database. As noted above, dynamically generating HDL files allows third party or user-defined modules to be implemented. In one example, a new digital signal processor is not provided in the generator program library or database. A user can provide an HDL generator script using the Perl programming language to allow full parameterization of the new digital signal processor.

A graphical user interface such as the wizard shown above can allow a user to not only select the newly designed digital signal processor, but can also allow the user to select parameters. The user can also specify whether the digital signal processor should take more logic and operate more quickly or take less logic and operate more slowly. A variety of tradeoff selections can be presented to a user. A variety of other parameters and peripherals are possible, as will be appreciated by one of skill in the art.

At 413, HDL files associated with a particular module are added to a synthesis list. A particular module such as a UART or a processor core may have several HDL files associated with it. At 413, the various HDL files are associated with the module in the synthesis list. The synthesis list can be provided to a synthesis program such as Leonardo Spectrum. Update information associated with the generated module can be provided to update a PTF file. Any information associated with the various modules during generation of the logic descriptions is referred to herein as update information. Update information can include the I/O ports associated with the generated module as well as a list of generated modules. The update information can be configured the interconnects between the various modules.

It can then be determined whether any modules remain in the PTF file from the input stage at 415. If modules remain, then the next module is identified to determine whether the module exists in a library or database at 407. The additional modules can then again be dynamically generated. If no modules remain, a peripheral bus module at 419 is generated to allow connection of the peripheral components, peripheral interfaces, and processor cores.

Generation of the peripheral bus module is described in more detail below. Generally, the peripheral bus module provides connections between the various modules for implementation on the programmable chip. Generation of the peripheral bus module at 419 allows generation of the system module at 421. A system module contains the various processor cores, peripheral interfaces, and peripheral components and describes how the modules connect with various other modules and components. A system module may use a portion of the logic on a programmable chip. For convenience, processor cores, buses, peripheral components, and peripheral interfaces can be referred to collectively as the system module. The system module can comprise parameterizable processor cores, buses, peripheral components, and peripheral interfaces. Typically, all components of the system module are provided via a common design tool such as the wizard described herein. It should be noted that the system module typically does not use all of the logic on the programmable chip. Other logic may remain to allow implementation of user defined modules, third party modules, and application specific logic. The system modules and non-system modules can be implemented concurrently on a programmable chip, or some modules may be implemented at a later time. As will be appreciated by on of skill in the art, logic for implementing various system and non-system modules can be interspersed throughout the programmable chip.

A wrapper file can be generated at 423. As will be appreciated by one of skill in the art, the wrapper file provides that the generated HDL file can be varied depending on environment. A wrapper file hides the architectural details of the system module and allows the system module to be treated as a black box. The wrapper file can also allow the synthesizable file to resemble an AHDL file, an Abel file, a VHDL file, or a Verilog file.

At 427, a synthesis command file is generated. The synthesis command file instructs the synthesis tools such as Leonardo Spectrum or Synplify on how exactly to synthesize the HDL files. As will be appreciated by one of skill in the art, synthesis tools may work well with only very particular HDL file formats. During generation of the various HDL files, the generation program tracks what synthesis tools will work with the various HDL file formats. The generator program can then automatically launch the appropriate synthesis tools without user intervention. Conventional techniques often specify that a user launch specific synthesis tools for specific HDL files. Generating a synthesis command file provides instructions for various synthesis tools to automatically synthesize generated HDL files.

Figure 5:
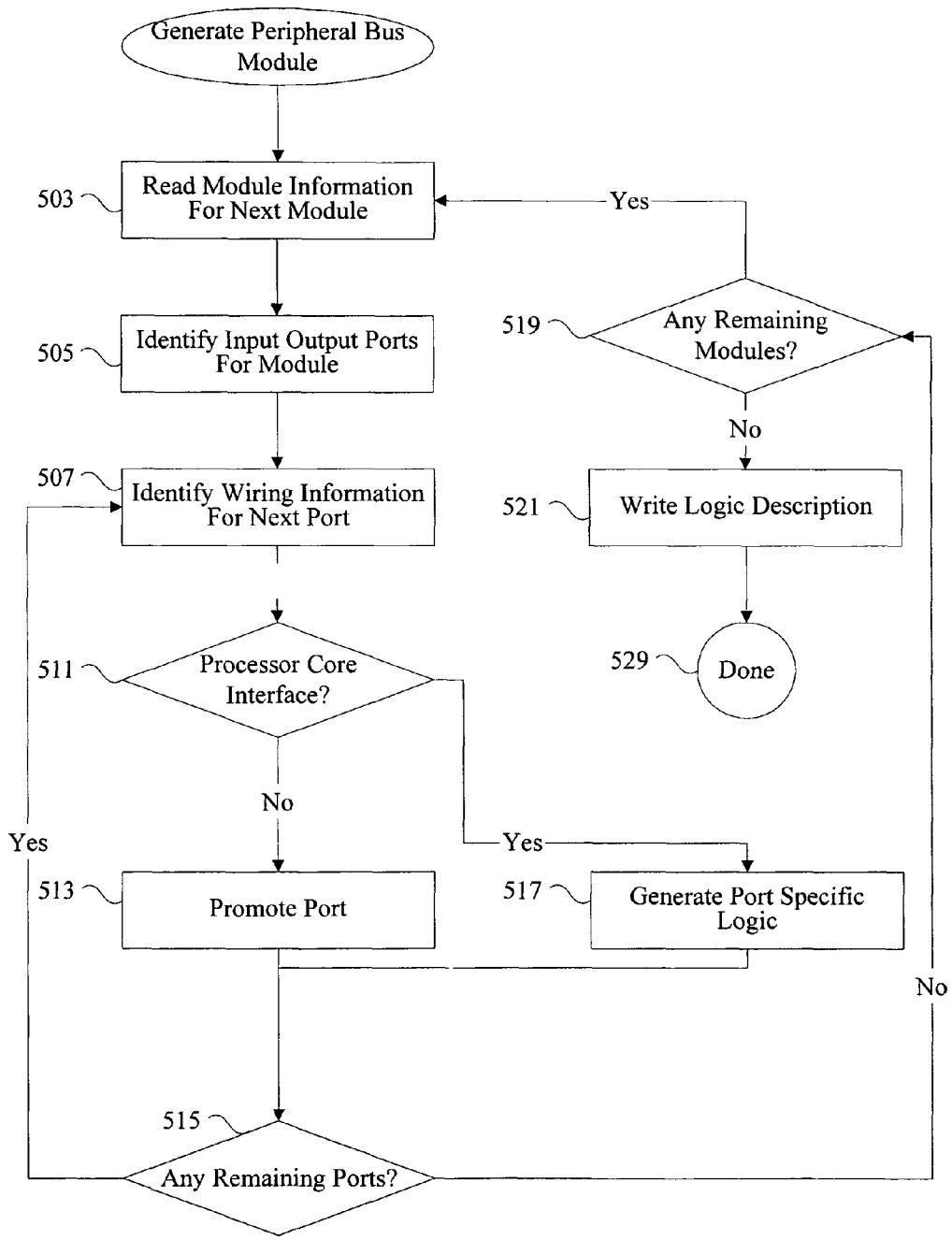
FIG. 5 is a process flow diagram of the generation of a bus module.

As noted above, a peripheral bus module can be generated to connect the various processor cores, peripheral components, and peripheral interfaces. FIG. 5 is a process flow diagram describing the generation of a peripheral bus module. Module information for a particular module can be read at 503. According to various embodiments, module information is read only if the module is a peripheral. As noted above, the module information may be contained in a PTF file provided by a wizard. Update information such as input and output ports for the module are identified at 505. Update information may also be contained in a PTF file. As noted above, update information is created when a module is generated with particular parameters. Update information may also be contained in a separate file.

At 507, wiring information for the port is determined. If it is determined that the port is coupled to a processor core or a peripheral at 511, logic describing port specific connections is generated at 517. The logic description provides port specific connections to allow peripherals and processor cores to communicate. If it is determined that the port is not coupled to a processor core or another peripheral at 511, the port is promoted. In other words, it is indicated that the port is provided to connect the module to off-chip components. The port can eventually be associated with a particular pin on an implemented programmable chip. The processes is repeated for other ports and other modules through determinations at 515 and 519. As will be appreciated by one of skill in the art, a peripheral bus module can contain logic for address decoding, wait state generation, data bus multiplexing, and interrupt control and prioritization. Various other components of a peripheral bus module can be implemented to allow more effective interconnections between modules. The various other components will also be appreciated by one of skill in the art. The logic description for the peripheral bus module incorporating the port information for the various peripherals and processor cores can be written at 521.

Figure 6A:
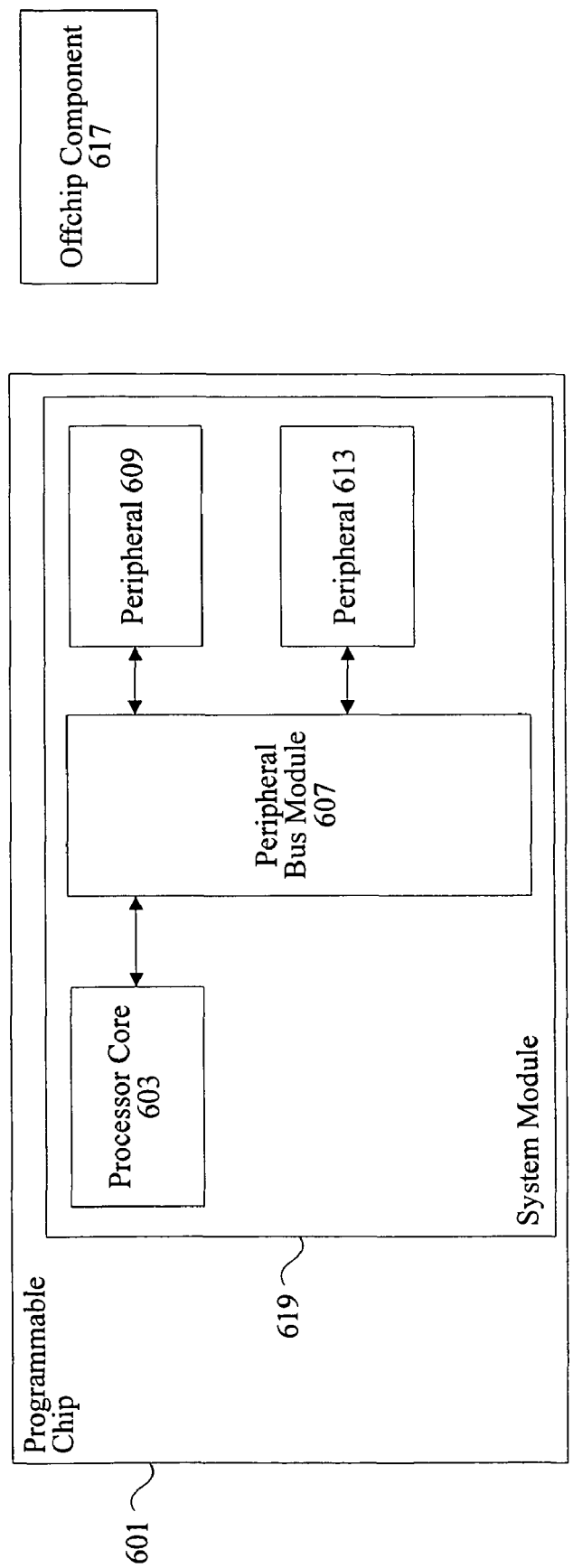
FIG. 6A is a diagrammatic representation of a programmable chip with a system module that can be generated.

FIG. 6A is a diagrammatic representation of a programmable chip containing dynamically generated modules. A programmable chip 601 contains logic for system module 619 as well as other modules (not shown). System module 619 contains a dynamically generated peripheral bus module 607. The dynamically generated peripheral bus module 607 allows interconnections between processor core 603 and peripheral 609 and 613. System module 619 allows interconnections between a peripheral 613 and off-chip components 617. System module 619 defines various interfaces to allow processor core 603, peripheral bus module 607, peripheral 609, and peripheral 613 to connect to off-chip components as well as other modules on the programmable chip 601.

Figure 6B:
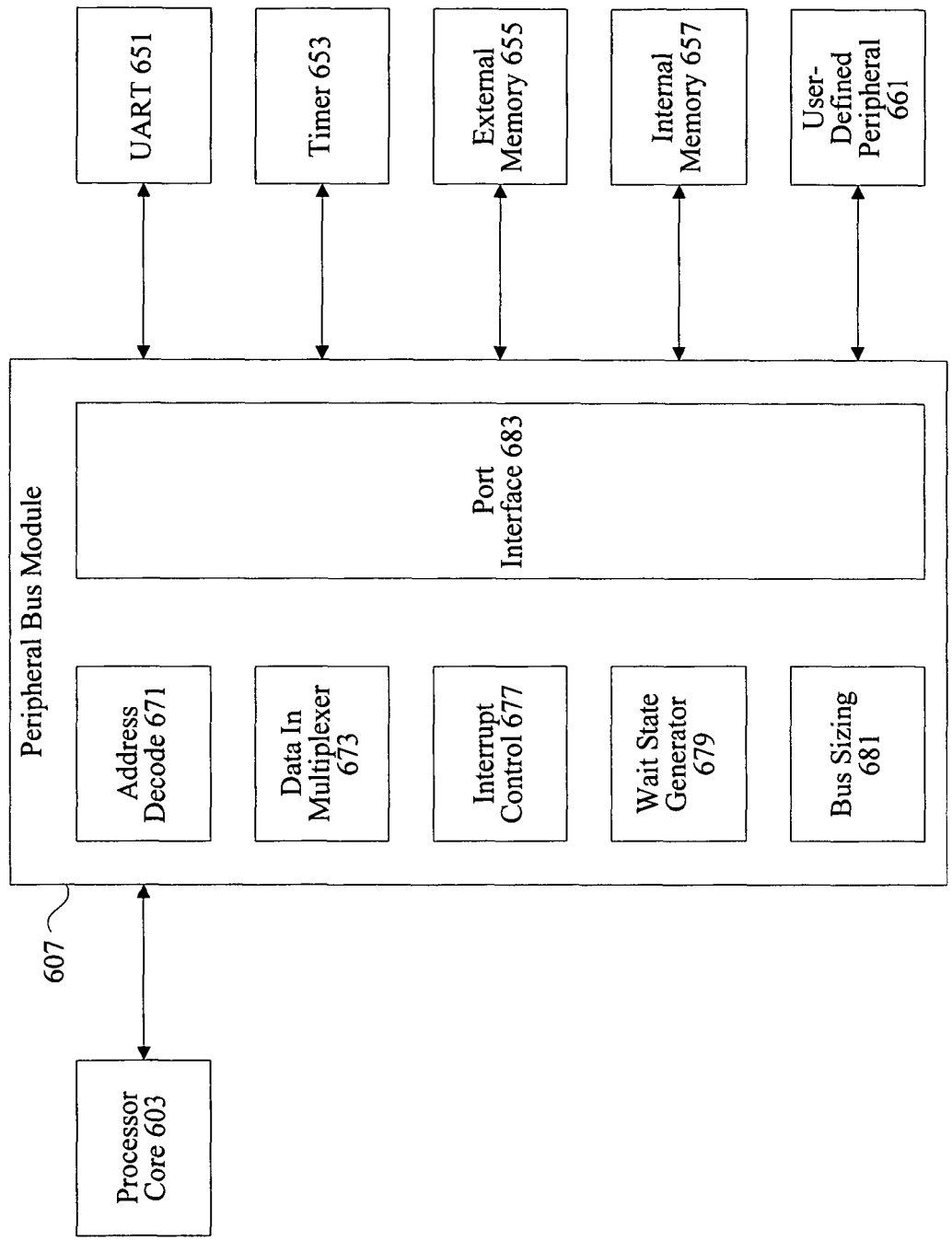
FIG. 6B is a diagrammatic representation of a peripheral bus module that can be generated.

FIG. 6B is a diagrammatic representation of a peripheral bus module. The peripheral bus module 607 may be dynamically generated to allow the coupling of processor core 603 to peripherals such as UART 651, timer 653, external memory 655, internal memory 657, and user-defined peripheral 661. The peripheral bus module 607 can contain a port interface 683. The peripheral bus module 607 may also to contain address decoding module 671, data in multiplexer 673, interrupt control module 677, wait state generator 679, and bus sizing module 681. The various modules will be appreciated by one of skill in the art. The address decoding module 671 can be used in systems where communication between a processor core and a peripheral uses input/output addresses as well as physical addresses. Peripheral addresses are decoded using the address decoding module 671. The data in multiplexer 673 typically is combinatorial logic that selects binary data from multiple input lines and directs them to an output line. A wait state generator 679 typically allows modules with different response times to interact. The interrupt control module 677 enables the detection and processing of interrupts from various modules. The bus sizing module 681 allows modules with a narrow bus width to operate in an environment specifying a wider bus width. For example, the bus sizing module 681 allows 8-bit, 16-bit, and 32-bit peripherals to operate in a 32-bit system bus mode environment.

Figure 7:
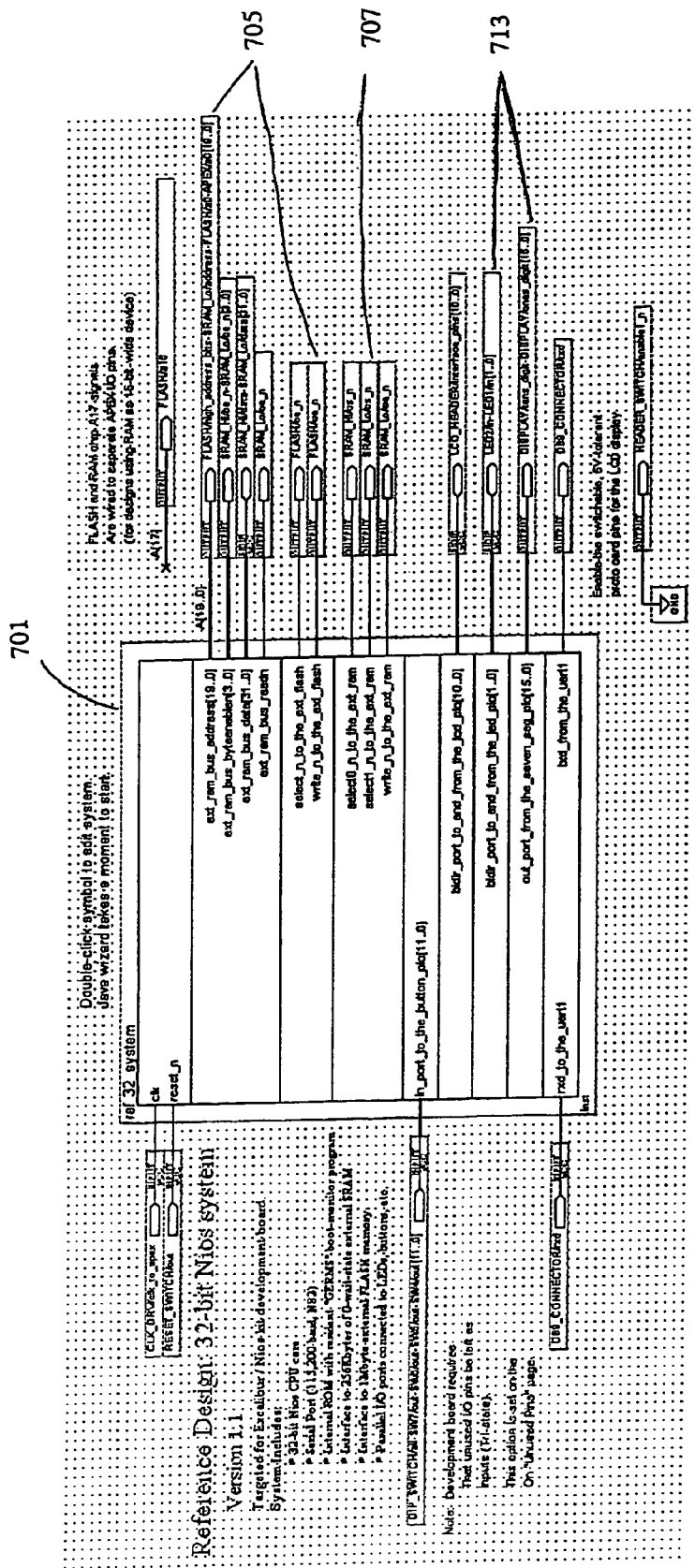
FIG. 7 is a diagrammatic representation of input and output interfaces associated with the system module.

FIG. 7 is a schematic representation of the interconnections provided by a system module. In one example, the system module 701 includes a 32-bit Nios processor core. The system module also contains a 115,200 bps serial port, internal read-only memory, an interface to external SRAM, an interface to external flash memory, and parallel input and output ports connected to LEDs, buttons, and keys. The interface to external flash memory is provided through input and output ports at 705. The interface to external SRAM is provided through input and output ports at 707. Parallel input output ports are shown at 713.

Embodiments of the present invention relate to an apparatus for performing the above-described operations. This apparatus may be specially constructed for the required purposes, or it may be a general-purpose computer selectively activated or reconfigured by a computer program stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various operations. The media may also include, alone or in combination with the program instructions, data files, data structures, and the like. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). The media may also be a transmission medium such as optical or metallic lines, wave guides, etc. including a carrier wave transmitting signals specifying the program instructions, data structures, etc. Examples of program instructions include both machine code, such as produced by a compiler, and files containing higher level code that may be executed by the computer using an interpreter.

Figure 8:
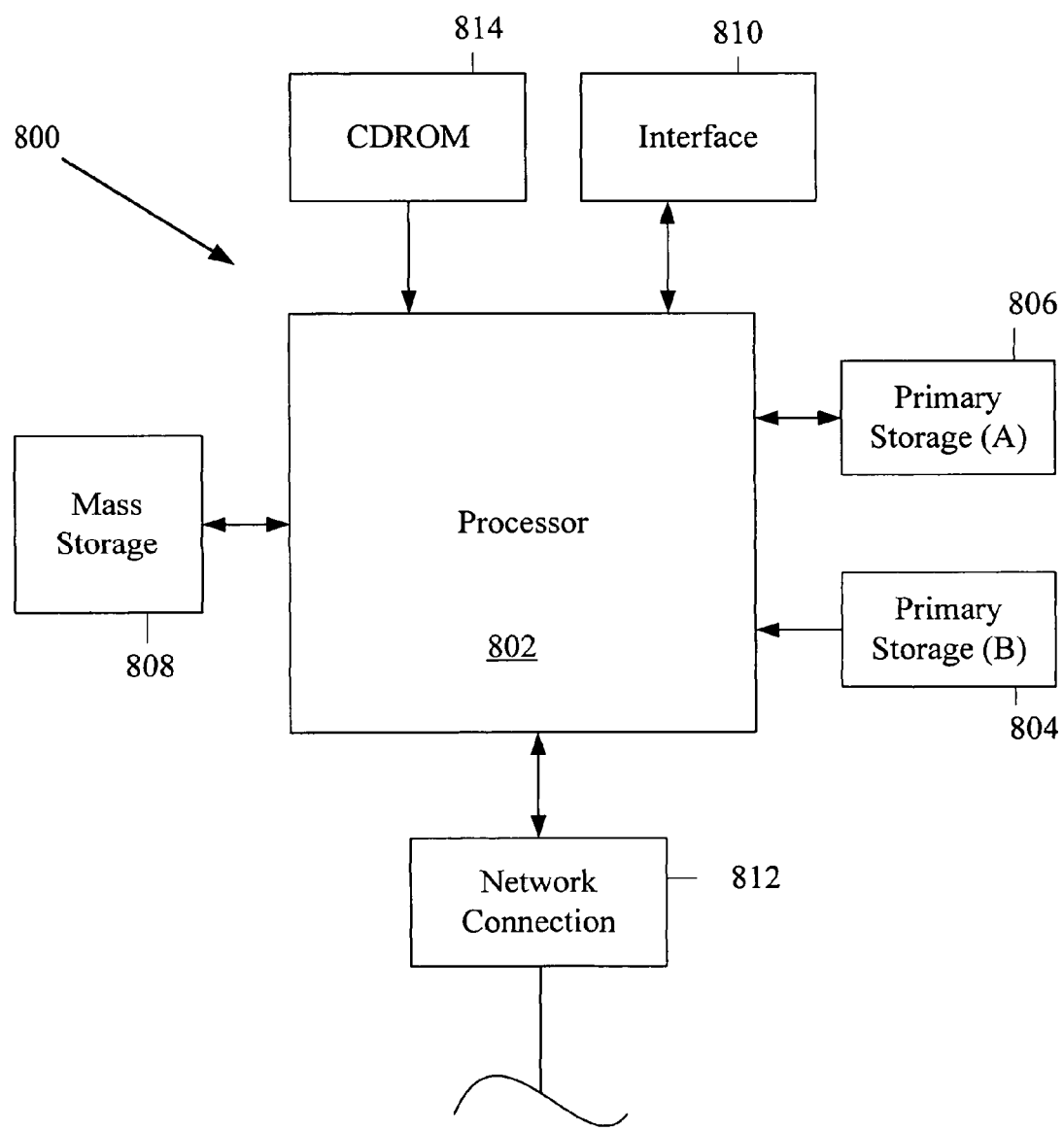
FIG. 8 is a diagrammatic representation of a system that can implement the techniques of the present invention.

FIG. 8 illustrates a typical computer system in accordance with an embodiment of the present invention. The computer system 800 includes any number of processors 802 (also referred to as central processing units, or CPUs) that are coupled to storage devices including primary storage 806 (typically a random access memory, or "RAM"), primary storage 804 (typically a read only memory, or "ROM"). The processors 802 can be configured to receive selections and parameters from a user to dynamically generate a logic description. The primary storage 806 can be used to hold a library or database of modules, as well as information on generating modules with particular parameter sets. As is well known in the art, primary storage 804 acts to transfer data and instructions uni-directionally to the CPU and primary storage 806 is used typically to transfer data and instructions in a bi-directional manner. Both of these primary storage devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than primary storage. It will be appreciated that the information retained within the mass storage device 808, may, in appropriate cases, be incorporated in standard fashion as part of primary storage 806 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Video monitors can be used to display wizards and subwizards to a user. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 808 or 814 and executed on CPU 808 in conjunction with primary memory 806.

Although many of the components and processes are described above in the singular for convenience, it will be appreciated by one of skill in the art that multiple components and repeated processes can also be used to practice the techniques of the present invention. For example, the programmable chip noted above is described as having a parameterizable processor core. It should be noted, however, that the programmable chip can also have multiple parameterizable processor cores operating in parallel.

While the invention has been particularly shown and described with reference to specific embodiments thereof, it will be understood by those skilled in the art that changes in the form and details of the disclosed embodiments may be made without departing from the spirit or scope of the invention. For example, the embodiments described above may be implemented using firmware, software, or hardware. Moreover, embodiments of the present invention may be employed with a variety of different file formats, languages, and communication protocols and should not be restricted to the ones mentioned above. Therefore, the scope of the invention should be determined with reference to the appended claims.

What is claimed is:

1. A method comprising:
   receiving a description of a first component for implementation on programmable hardware, wherein the first component is parameterizable;
   identifying a component parameter associated with the first component, the component parameter received at an input interface; and
   generating a logic description using a computer system processor, wherein the logic description includes the first component and a second component, wherein the second component includes a device driver generated by the computer system processor based on the component parameter associated with the first component.

2. The method of claim 1, wherein the second component is a peripheral component.

3. The method of claim 1, wherein the second component comprises a peripheral interface.

4. The method of claim 1, further comprising generating interconnection logic for coupling the first component to other components implemented on the programmable hardware, wherein the interconnection logic is parameterized based on the component parameter.

5. The method of claim 1, wherein the logic description comprises a synthesizable logic file.

6. The method of claim 5, wherein the logic description is provided in a hardware description language (HDL) file.

7. The method of claim 1, wherein the logic description comprises a synthesized logic file.

8. The method of claim 7, wherein the logic description is provided in an electronic data interchange format (EDF) file.

9. A method comprising:
   receiving a processor core design associated with a programmable chip, wherein the processor core design is parameterizable;
   identifying a processor core parameter associated with the processor core design, the processor core parameter received at an input interface; and
   generating a logic description using a computer system processor, the logic description generated after parameterizing the processor core design using the processor core parameter, wherein the logic description includes the processor core design and a component, wherein the component includes a device driver generated by the computer system processor based on the processor core parameter associated with the processor core design.

10. The method of claim 9, wherein the component is a peripheral design associated with the programmable chip, and wherein a peripheral design parameter is associated with the peripheral design.

11. The method of claim 10, wherein the peripheral design is a peripheral interface.

12. The method of claim 10, wherein the peripheral design is a universal asynchronous receiver/transmitter (UART).

13. The method of claim 10, wherein the peripheral design is a timer.

14. The method of claim 10, wherein the peripheral design is an interface to off-chip memory.

15. The method of claim 9, wherein the logic description comprises a synthesizable logic file.

16. The method of claim 15, wherein the logic description is provided in a hardware description language (HDL) file.

17. The method of claim 9, wherein the logic description comprises a synthesized logic file.

18. The method of claim 17, wherein the logic description is provided in an electronic data interchange format (EDF) file.

19. A method comprising:
   receiving a peripheral design associated with a programmable chip, wherein the peripheral design is parameterizable;
   identifying a peripheral design parameter associated with the peripheral design, the peripheral design parameter received at an input interface; and
   generating a logic description using a computer system processor, the logic description generated after parameterizing the peripheral design using the peripheral design parameter, wherein the logic description includes the peripheral design and a component, wherein the component includes a device driver generated by the computer system processor based on the peripheral design parameter associated with the peripheral design.

20. The method of claim 19, wherein the component is a processor core design associated with the programmable chip, and wherein a processor core design parameter is associated with the processor core design.

21. The method of claim 19, wherein the peripheral design is a peripheral interface.

22. The method of claim 19, wherein the peripheral design is a universal asynchronous receiver/transmitter (UART).

23. The method of claim 19, wherein the peripheral design is a timer.

24. The method of claim 19, wherein the peripheral design is a custom peripheral component.

25. The method of claim 19, wherein the logic description comprises a synthesizable logic file.

26. The method of claim 25, wherein the logic description is provided in a hardware description language (HDL) file.

27. The method of claim 19, wherein the logic description comprises a synthesized logic file.

28. The method of claim 27, wherein the logic description is provided in an electronic data interchange format (EDF) file.

29. The method of claim 10, wherein the processor core design, the processor core parameter, and the peripheral design are received via a single input interface.

30. The method of claim 29, wherein the single input interface comprises a wizard.

31. The method of claim 10, wherein the logic description comprises a description of both the processor core and peripheral design, and wherein the logic description is provided to a synthesis tool.

32. The method of claim 10, wherein the logic description comprises a description of both the processor core and peripheral design, and wherein the logic description is provided to a place and route tool.

33. The method of claim 20, wherein the processor core design, the peripheral design, and the peripheral parameter are received via a single input interface.

34. The method of claim 33, wherein the single input interface comprises a wizard.

35. The method of claim 20, wherein the logic description comprises a description of both the processor core and peripheral design, and wherein the logic description is provided to a synthesis tool.

36. The method of claim 20, wherein the logic description comprises a description of both the processor core and peripheral design, and wherein the logic description is provided to a place and route tool.

37. A non-transitory computer readable storage medium having instructions stored therein for performing a method, the method comprising:
   receiving a description of a first component for implementation on programmable hardware, wherein the first component is a parameterizable processor core;
   identifying a first component parameter associated with the first component, the first component parameter received at an input interface;
   receiving a description of a second component for implementation on the programmable hardware, wherein the second component is parameterizable;
   identifying a second component parameter associated with the second component, the second component parameter received at the input interface; and
   generating a logic description using a computer system processor, the logic description generated after parameterizing the first component using the first component parameter and parameterizing the second component using the second component parameter, wherein the logic description includes the first component and the second component, wherein the second component includes a device driver generated by the computer system processor based on the first component parameter associated with the first component.

38. The non-transitory computer readable storage medium of claim 37, the method further comprising receiving the description of the first component, identifying the first component parameter, receiving the description of the second component, identifying the second component parameter, and generating the logic description via a single input interface.

39. The non-transitory computer readable storage medium of claim 37, the method further comprising providing the logic description to a synthesis tool.

40. The non-transitory computer readable storage medium of claim 37, the method further comprising providing the logic description to a place and route tool.

* * * * *

UNITED STATES PATENT AND TRADEMARK OFFICE
CERTIFICATE OF CORRECTION

| | | |
|---|---|---|
| PATENT NO. | : 8,132,132 B2 | Page 1 of 1 |
| APPLICATION NO. | : 11/372550 | |
| DATED | : March 6, 2012 | |
| INVENTOR(S) | : Tim Allen et al. | |

It is certified that error appears in the above-identified patent and that said Letters Patent is hereby corrected as shown below:

On the application title page, the listed city of residence for the fourth-named inventor in field (75) "Bryan Hoyer, Santa Cruz, CA (US)" should be changed to --Bryan Hoyer, Boulder Creek, CA (US)--.

Signed and Sealed this
Eighth Day of May, 2012

David J. Kappos
*Director of the United States Patent and Trademark Office*